(12) United States Patent
Ota et al.

(10) Patent No.: US 12,177,588 B2
(45) Date of Patent: Dec. 24, 2024

(54) PHOTOELECTRIC CONVERSION DEVICE AND PHOTODETECTION SYSTEM HAVING AVALANCHE DIODE

(71) Applicant: CANON KABUSHIKI KAISHA, Tokyo (JP)

(72) Inventors: Yasuharu Ota, Tokyo (JP); Tomoya Sasago, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 395 days.

(21) Appl. No.: 17/580,135

(22) Filed: Jan. 20, 2022

(65) Prior Publication Data
US 2022/0239857 A1 Jul. 28, 2022

(30) Foreign Application Priority Data

Jan. 22, 2021 (JP) .................................. 2021-008658

(51) Int. Cl.
H04N 25/75 (2023.01)
H01L 27/146 (2006.01)
H04N 25/74 (2023.01)
H04N 25/76 (2023.01)

(52) U.S. Cl.
CPC ....... H04N 25/75 (2023.01); H01L 27/14614 (2013.01); H01L 27/14643 (2013.01); H01L 27/14689 (2013.01); H04N 25/74 (2023.01); H04N 25/76 (2023.01)

(58) Field of Classification Search
CPC ........ H04N 25/75; H04N 25/74; H04N 25/76; H04N 25/772; H01L 27/14614; H01L 27/14643; H01L 27/14689
See application file for complete search history.

(56) References Cited

U.S. PATENT DOCUMENTS

| 2019/0068908 A1* | 2/2019 | Kobayashi | G01S 7/4863 |
| 2019/0174120 A1* | 6/2019 | Wang | H04N 25/77 |
| 2020/0035710 A1* | 1/2020 | Gocho | H01L 27/144 |
| 2020/0252564 A1* | 8/2020 | Palubiak | H01L 31/02027 |

FOREIGN PATENT DOCUMENTS

| JP | 2015-084092 A | 4/2015 |
| JP | 2019-140524 A | 8/2019 |
| JP | 2019158806 A | 9/2019 |
| JP | 2020-123847 A | 8/2020 |

* cited by examiner

Primary Examiner — Twyler L Haskins
Assistant Examiner — John H Morehead, III
(74) Attorney, Agent, or Firm — Canon U.S.A., Inc. IP Division

(57) ABSTRACT

The photoelectric conversion device includes a pixel. The pixel includes a photoelectric conversion unit and a signal processing circuit. The photoelectric conversion unit includes an avalanche diode that multiplies charge generated by an incident of photon by avalanche multiplication, and outputting a first signal in accordance with the incident of photon. The signal processing circuit includes a logic circuit that outputs a third signal in response to the first signal and a second signal. The signal processing circuit includes a first element having a first withstand voltage and a second element having a second withstand voltage lower than the first withstand voltage, and is configured such that the first signal is input to the first element and the second signal is input to the second element.

26 Claims, 20 Drawing Sheets

PHOTOELECTRIC CONVERSION DEVICE AND PHOTODETECTION SYSTEM HAVING AVALANCHE DIODE

BACKGROUND

Technical Field

One disclosed aspect of the embodiments relates to a photoelectric conversion device and a photodetection system.

Description of the Related Art

A single photon avalanche diode (SPAD) is known as a detector capable of detecting weak light at a single photon level. SPAD amplifies signal charge excited by photon by several times to several million times by using an avalanche multiplication phenomenon generated by a strong electric field induced in a p-n junction of a semiconductor. The number of incident photons can be directly measured by converting the current generated by the avalanche multiplication phenomenon into a pulse signal and counting the number of pulse signals.

Since an image sensor using SPAD has a larger number of elements constituting one pixel than a complementary metal oxide semiconductor (CMOS) image sensor, how to reduce the area of a pixel circuit is important in order to achieve miniaturization of pixels and improvement of aperture ratio. Japanese Patent Application Laid-Open No. 2019-158806 discloses a technique for reducing a circuit area per pixel by configuring a plurality of light receiving portions to share a recharge control unit. However, the technique described in Japanese Patent Application Laid-Open No. 2019-158806 is not intended to reduce the area of the pixel circuit itself.

SUMMARY

One aspect of the embodiments is to provide a photoelectric conversion device and a photodetection system in which the area efficiency of elements constituting a pixel circuit is improved, and in turn, the pixel circuit is improved in performance and functionality.

According to an aspect of the embodiments, a photoelectric conversion device includes a pixel. The pixel includes a photoelectric conversion unit and a signal processing circuit. The photoelectric conversion unit includes an avalanche diode that multiplies charge generated by an incident of photon by avalanche multiplication, and outputting a first signal in accordance with the incident of photon. The signal processing circuit includes a logic circuit that outputs a third signal in response to the first signal and a second signal. The signal processing circuit includes a first element having a first withstand voltage and a second element having a second withstand voltage lower than the first withstand voltage. The first signal is input to the first element and the second signal is input to the second element.

According to another aspect of the embodiments, a photoelectric conversion device includes a pixel. The pixel includes a photoelectric conversion unit and a signal processing circuit. The photoelectric conversion unit includes an avalanche diode that multiplies charge generated by an incident of photon by avalanche multiplication, and outputting a first signal in accordance with the incident of photon. The signal processing circuit includes a logic circuit that outputs a third signal in response to the first signal and a second signal. The signal processing circuit includes a first element and a second element. The first signal is input to the first element, and the second signal is input to the second element. A thickness of a gate insulating film of a transistor included in the first element is thicker than a thickness of a gate insulating film of a transistor included in the second element.

Further features of the embodiments will become apparent from the following description of exemplary embodiments with reference to the attached drawings.

DESCRIPTION OF THE EMBODIMENTS

Figure 1:
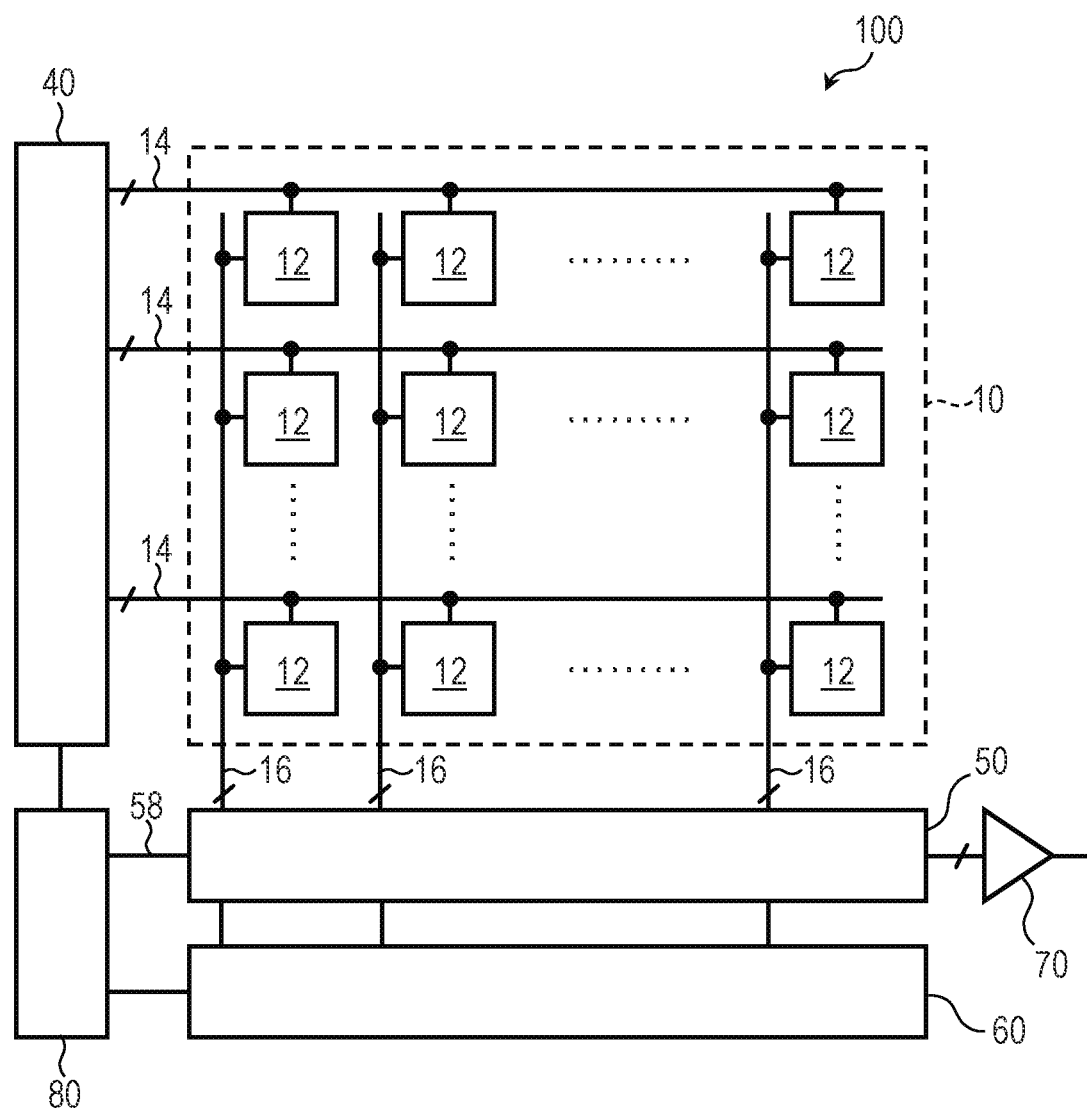
FIG. 1 and FIG. 2 are block diagrams illustrating a schematic configuration of a photoelectric conversion device according to a first embodiment.

Preferred embodiments will now be described in detail in accordance with the accompanying drawings.

The following embodiments are intended to embody the technical idea of the disclosure and do not limit the disclosure. The sizes and positional relationships of the members illustrated in the drawings may be exaggerated for clarity of description.

First Embodiment

Figure 2:
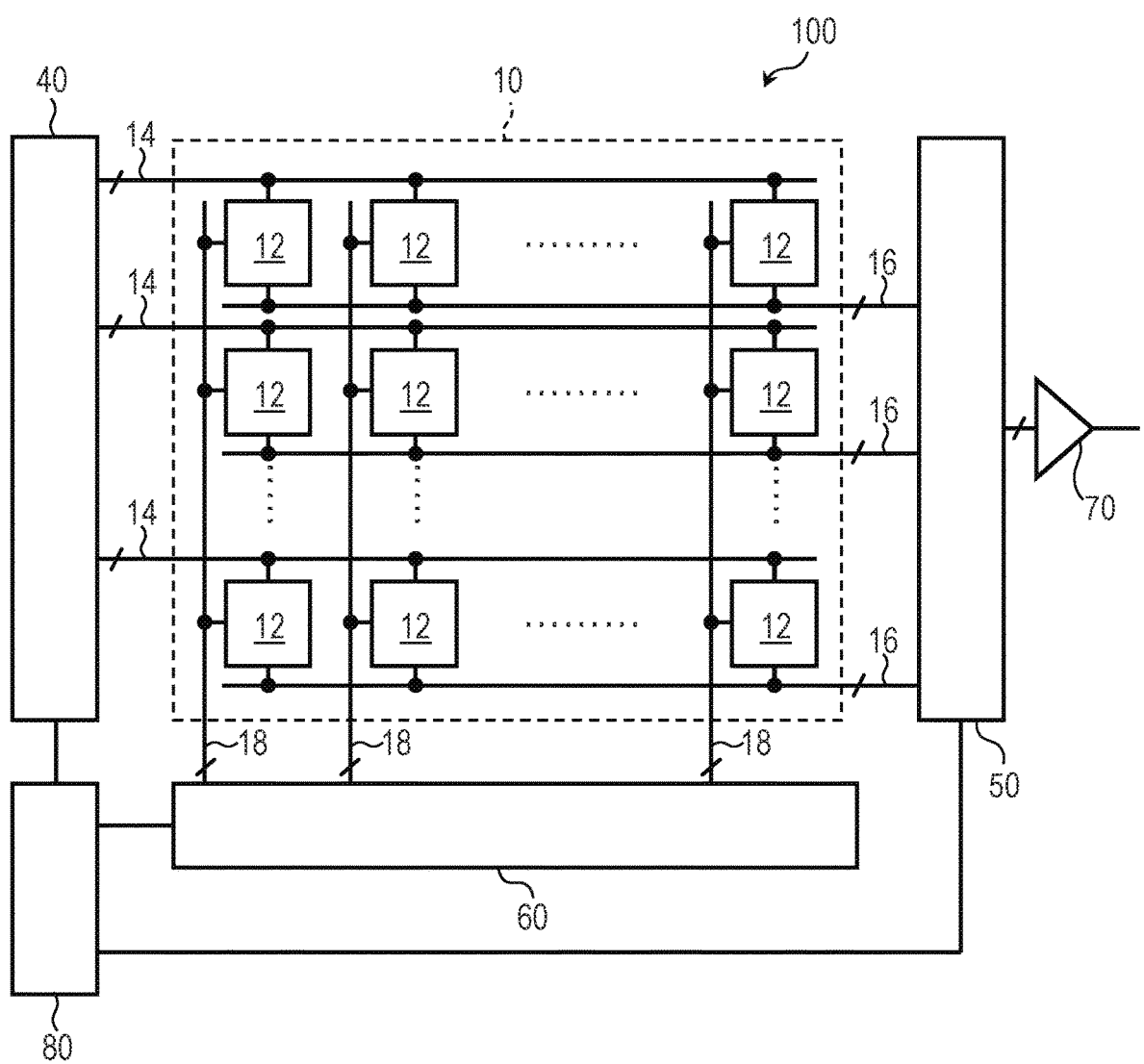
Figure 3:
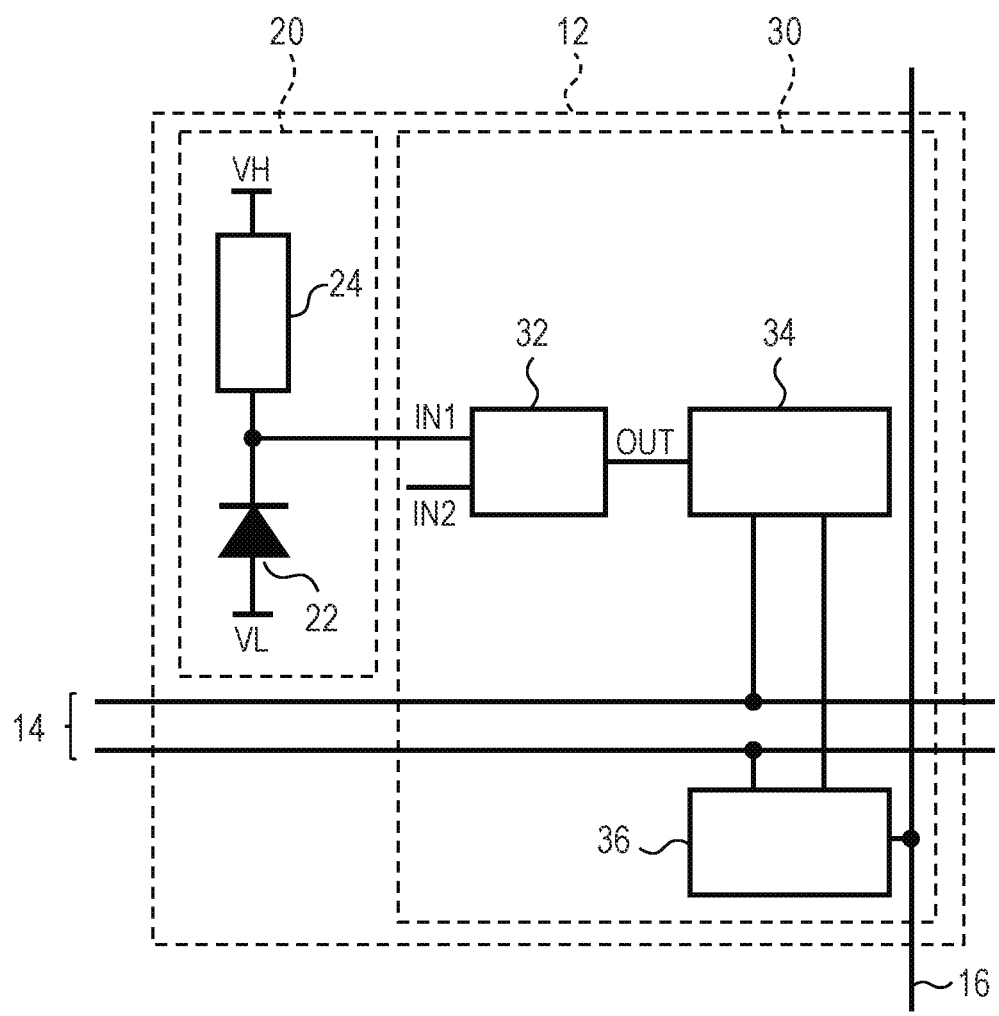
FIG. 3 is a block diagram illustrating a configuration example of a pixel in the photoelectric conversion device according to the first embodiment.
Figure 4:
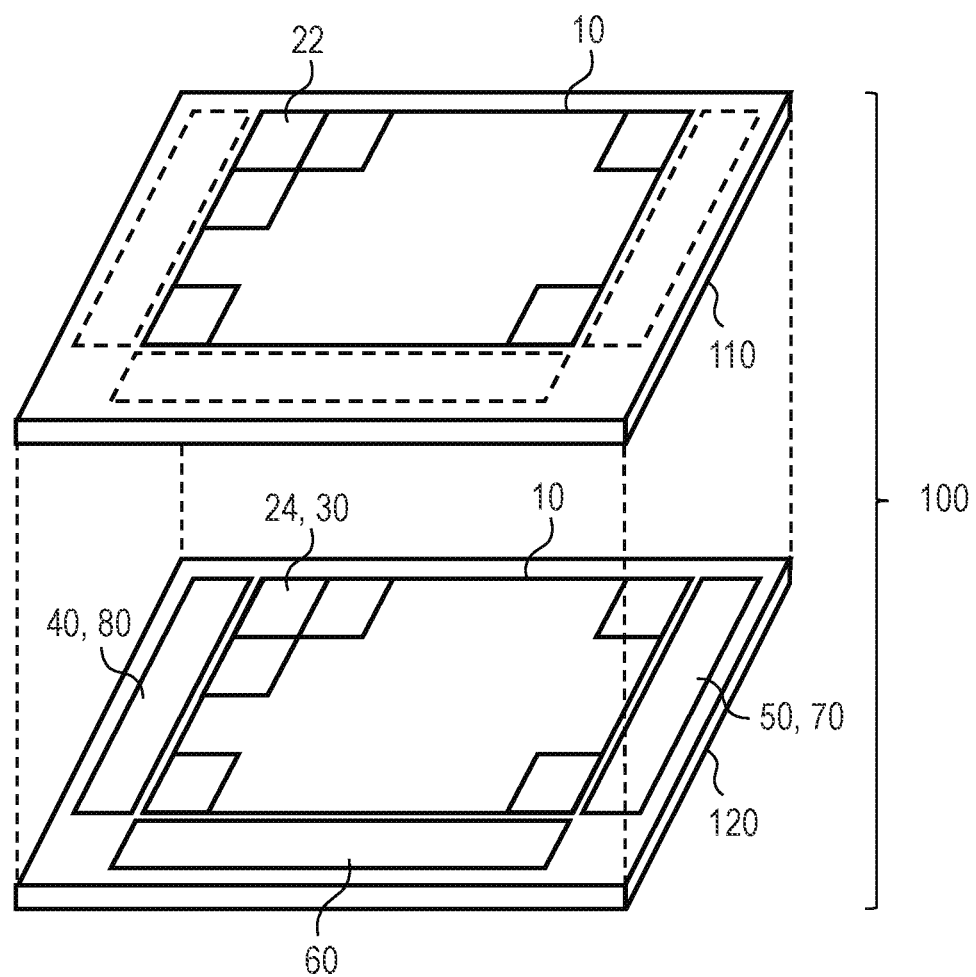
FIG. 4 is a perspective view illustrating a configuration example of the photoelectric conversion device according to the first embodiment.
Figure 5A:
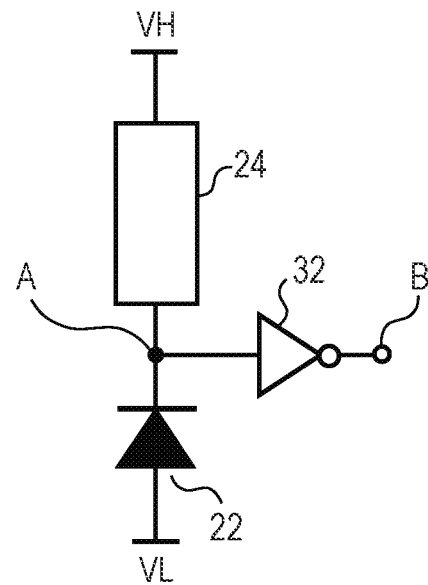
FIG. 5A, FIG. 5B, and FIG. 5C are diagrams illustrating the basic operation of the photoelectric conversion unit in the photoelectric conversion device according to the first embodiment.
Figure 5B:
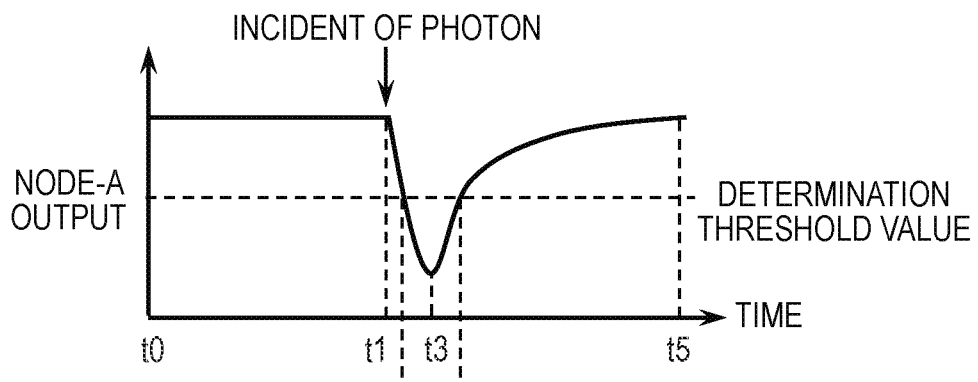
Figure 5C:
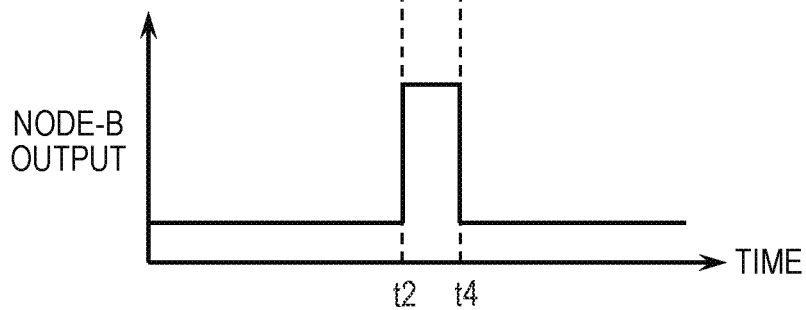
Figure 7A:
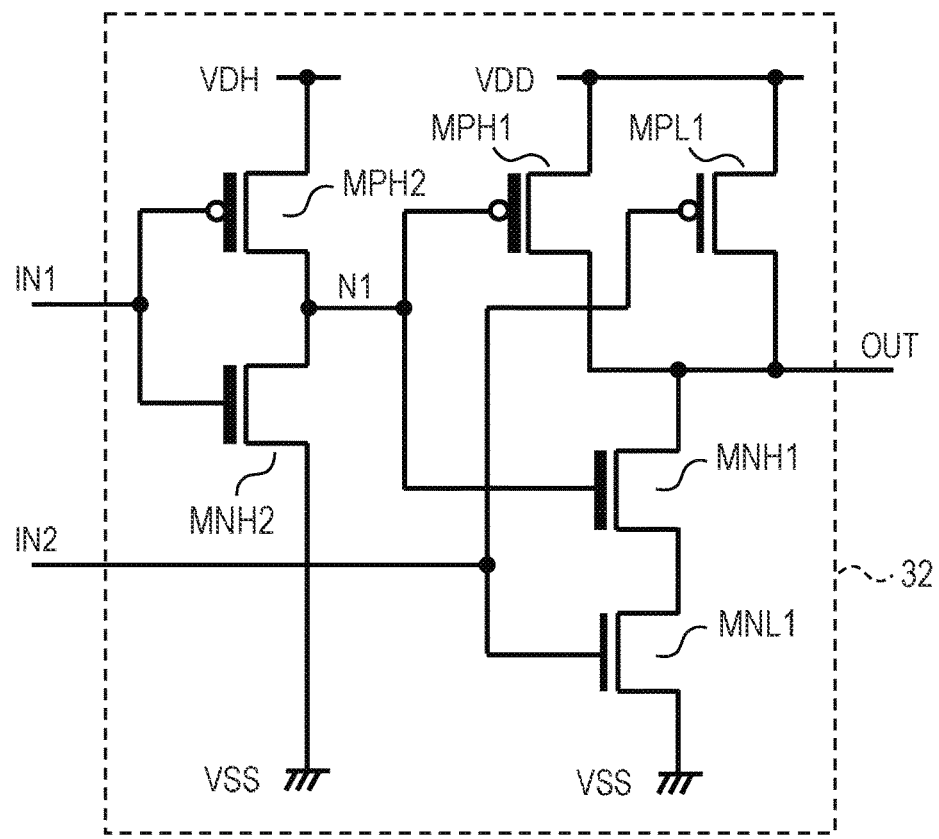
FIG. 7A and FIG. 7B are diagrams illustrating a configuration example and an operation of the signal processing circuit in the photoelectric conversion device according to the first embodiment (Part 2).
Figure 8:
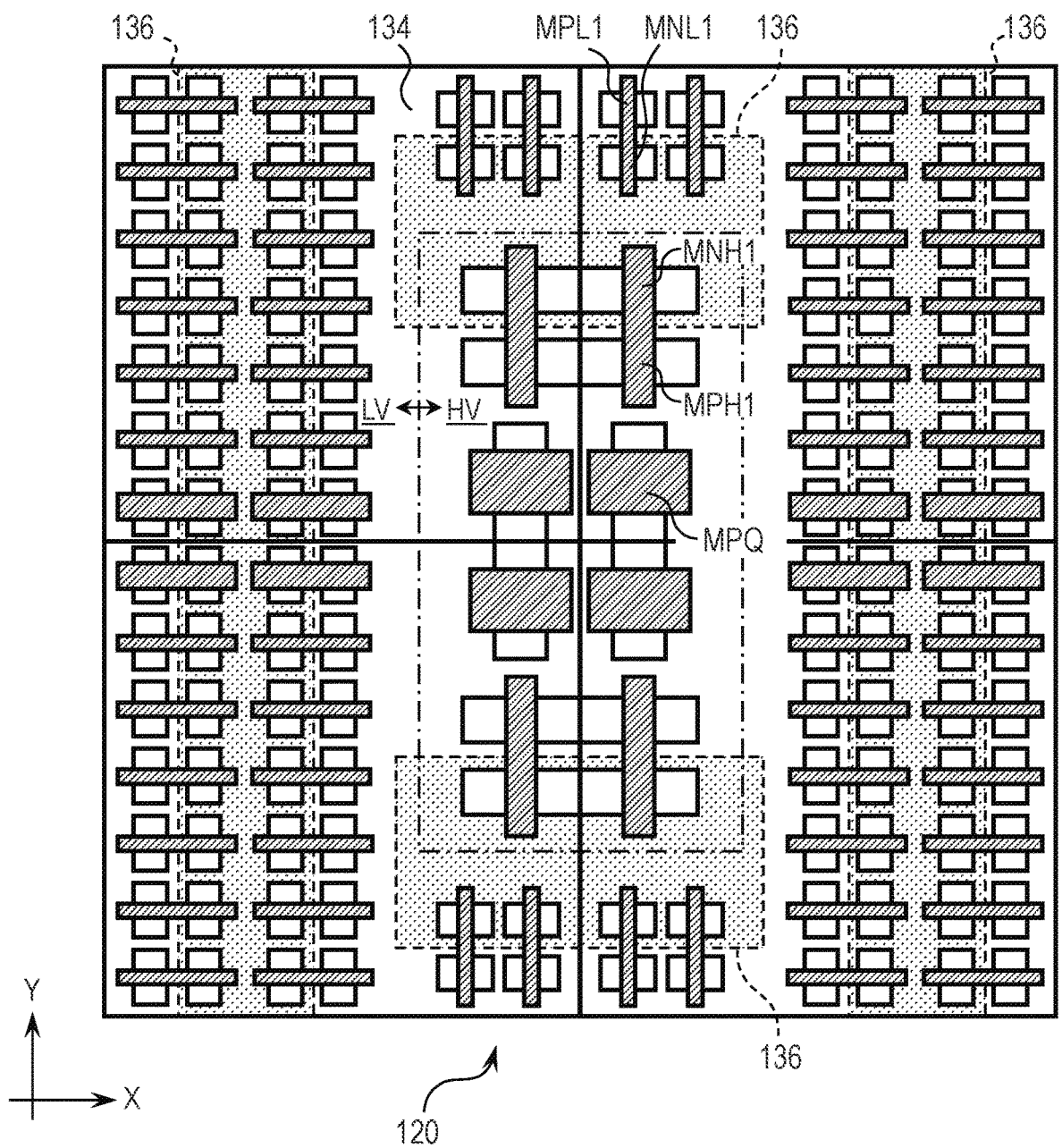
FIG. 8, FIG. 9A, FIG. 9B, and FIG. 10 are plan views illustrating an example of arrangement of elements in the photoelectric conversion device according to the first embodiment.
Figure 9A:
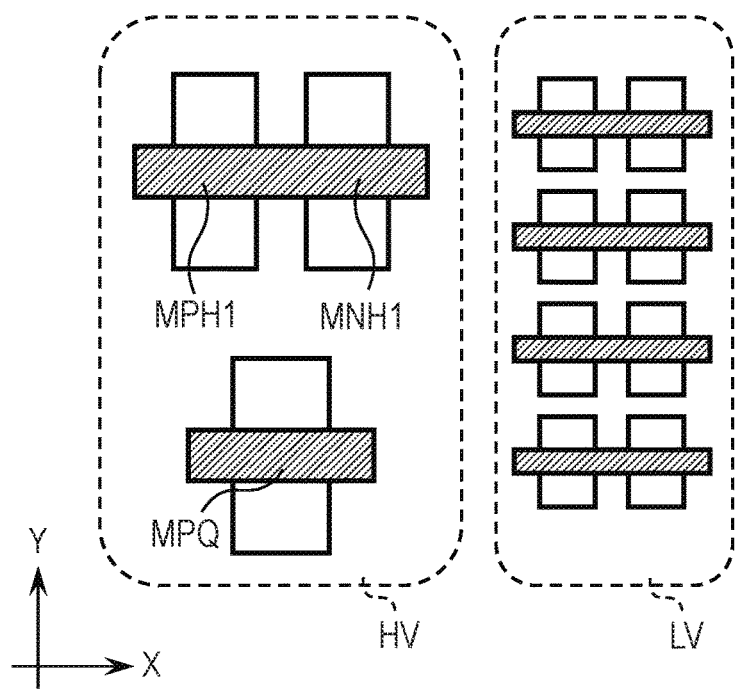
Figure 9B:
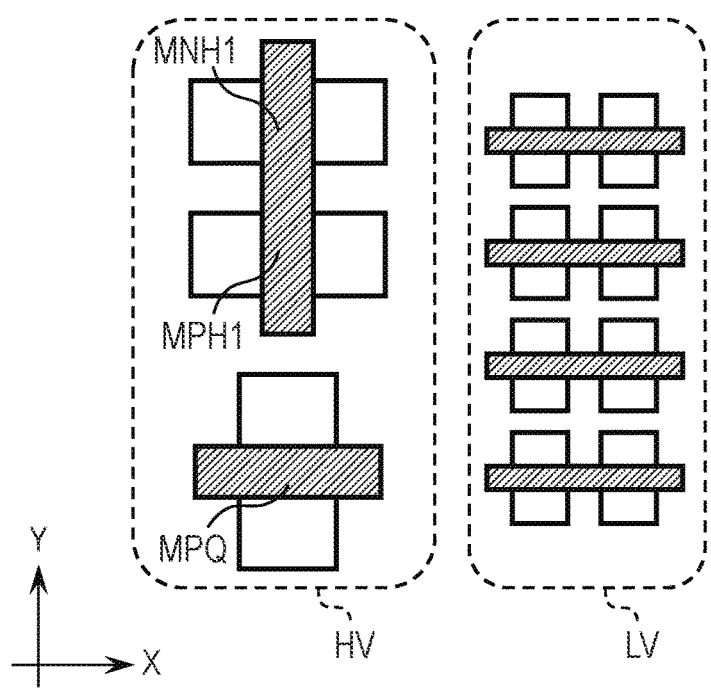
Figure 10:
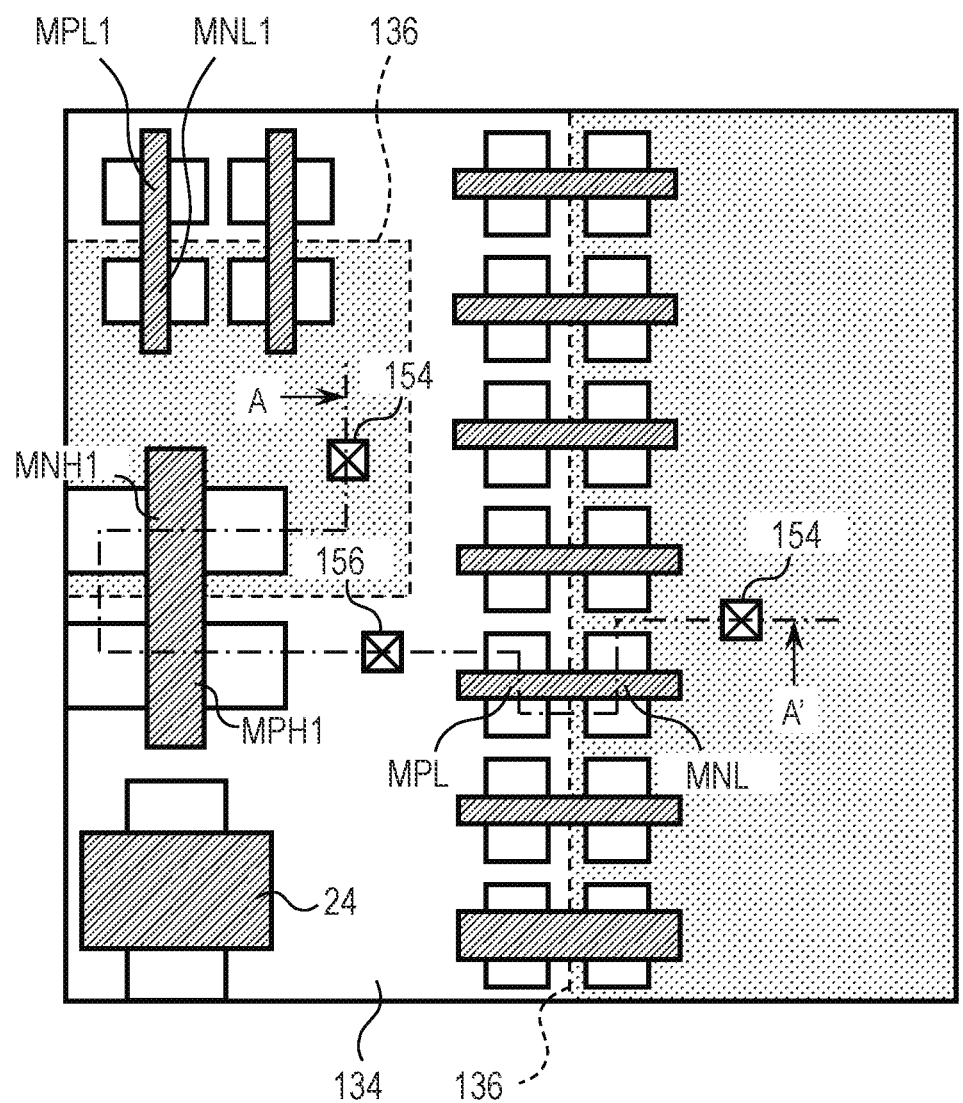
Figure 11:
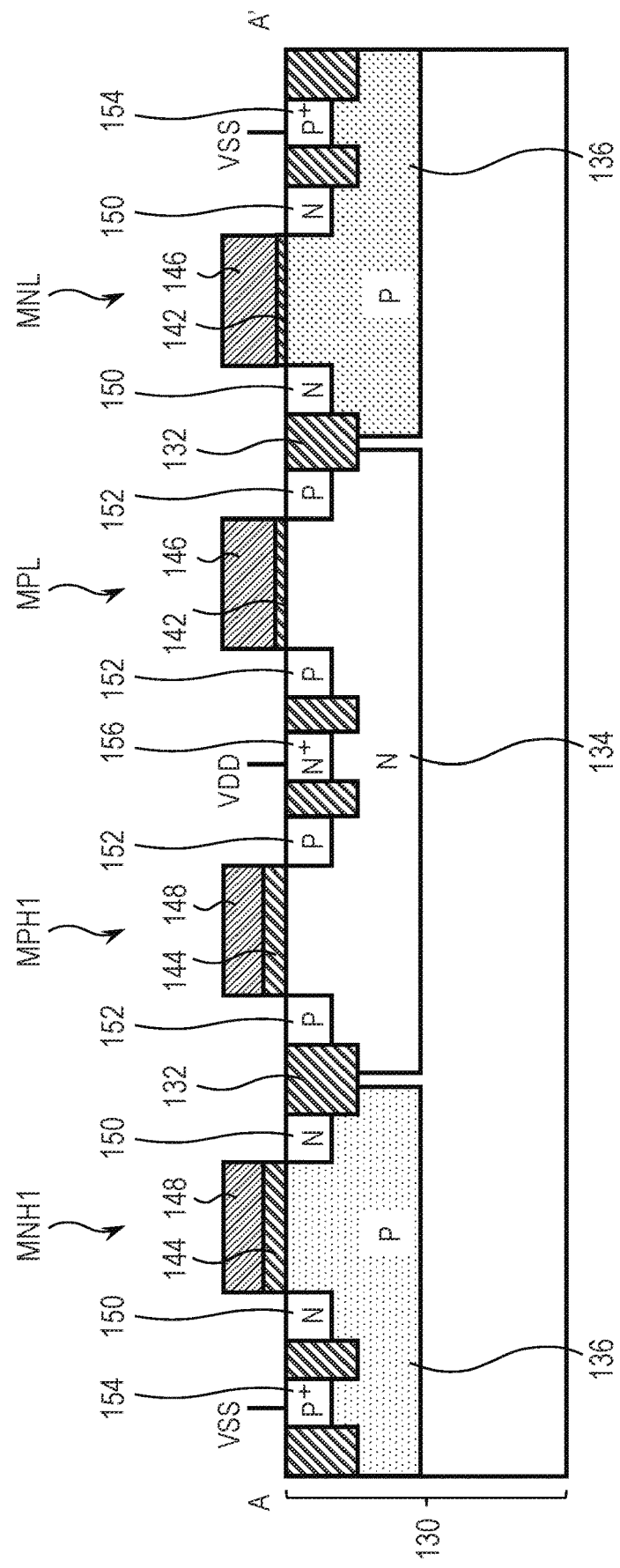
FIG. 11 is a schematic cross-sectional view illustrating a configuration example of a high withstand voltage transistor and a low withstand voltage transistor used in the photoelectric conversion device according to the first embodiment.

A photoelectric conversion device according to a first embodiment will be described with reference to FIG. 1 to FIG. 12F. FIG. 1 and FIG. 2 are block diagrams illustrating a schematic configuration of a photoelectric conversion device according to the present embodiment. FIG. 3 is a block diagram illustrating a configuration example of a pixel of the photoelectric conversion device according to the present embodiment. FIG. 4 is a perspective view illustrating a configuration example of the photoelectric conversion device according to the present embodiment. FIG. 5A to FIG. 5C are diagrams illustrating the basic operation of the photoelectric conversion unit of the photoelectric conversion device according to the present embodiment. FIG. 6A to FIG. 7B are diagrams illustrating a configuration example and an operation of the signal processing circuit of the photoelectric conversion device according to the present embodiment. FIG. 8 to FIG. 10 are plan views illustrating an example of arrangement of elements in the photoelectric conversion device according to the present embodiment. FIG. 11 is a schematic cross-sectional view illustrating a configuration example of a high withstand voltage transistor and a low withstand voltage transistor used in the photoelectric conversion device according to the present embodiment. FIG. 12A to FIG. 12F are cross-sectional views illustrating a method of manufacturing the high withstand voltage transistor and the low withstand voltage transistor used in the photoelectric conversion device according to the present embodiment.

As illustrated in FIG. 1, the photoelectric conversion device 100 according to the present embodiment includes a pixel unit or circuit 10, a vertical scanning circuit unit 40, a readout circuit unit 50, a horizontal scanning circuit unit 60, an output circuit unit 70, and a control pulse generation unit or circuit 80.

The pixel unit 10 is provided with a plurality of pixels 12 arranged in an array so as to form a plurality of rows and a plurality of columns. As will be described later, each pixel 12 may include a photoelectric conversion unit or circuit including a photon detection element and a pixel signal processing unit or circuit that processes a signal output from the photoelectric conversion unit. The number of pixels 12 included in the pixel unit 10 is not particularly limited. For example, the pixel unit 10 may be constituted by a plurality of pixels 12 arranged in an array of several thousand rows×several thousand columns like a general digital camera. Alternatively, the pixel unit 10 may be formed of a plurality of pixels 12 arranged in one row or one column. Alternatively, the pixel unit 10 may be formed of one pixel 12.

In each row of the pixel array of the pixel unit 10, a control line 14 is arranged so as to extend in a first direction (a lateral direction in FIG. 1). Each of the control lines 14 is connected to the pixels 12 aligned in the first direction, and forms a signal line common to these pixels 12. The first direction in which the control lines 14 extend may be referred to as a row direction or a horizontal direction. Each of the control lines 14 may include a plurality of signal lines for supplying a plurality of types of control signals to the pixels 12.

In each column of the pixel array of the pixel unit 10, a data line 16 is arranged so as to extend in a second direction (vertical direction in FIG. 1) intersecting the first direction. Each of the data lines 16 is connected to the pixels 12 aligned in the second direction, and forms a signal line common to these pixels 12. The second direction in which the data lines 16 extend may be referred to as a column direction or a vertical direction. Each of the data lines 16 may include a plurality of signal lines for transferring a digital signal of a plurality of bits output from the pixel 12 on a bit-by-bit basis.

The control lines 14 in each row are connected to the vertical scanning circuit unit 40. The vertical scanning circuit unit 40 is a control unit having a function of receiving a control signal output from the control pulse generation unit 80, generating a control signal for driving the pixels 12, and supplying the control signal to the pixels 12 via the control line 14. A logic circuit such as a shift register or an address decoder may be used for the vertical scanning circuit unit 40. The vertical scanning circuit unit 40 sequentially scans the pixels 12 in the pixel unit 10 row by row to thereby output pixel signals of the pixels 12 to the readout circuit unit 50 via the data lines 16.

The data lines 16 in each column are connected to the readout circuit unit 50. The readout circuit unit 50 includes a plurality of holding units (not illustrated) provided corresponding to respective columns of the pixel array of the pixel unit 10, and has a function of holding pixel signals of the pixels 12 of respective columns output from the pixel unit 10 via the data lines 16 in units of rows in the holding unit of the corresponding columns.

The horizontal scanning circuit unit 60 is a control unit that receives a control signal output from the control pulse generation unit 80, generates a control signal for reading out the pixel signal from the holding unit of each column of the readout circuit unit 50, and supplies the control signal to the readout circuit unit 50. A logic circuit such as a shift register or an address decoder may be used for the horizontal scanning circuit unit 60. The horizontal scanning circuit unit 60 sequentially scans the holding units of the respective columns of the readout circuit unit 50 to thereby sequentially output pixel signals held in the holding units to the output circuit unit 70.

The output circuit unit 70 has an external interface circuit and is a circuit unit configured to output the pixel signals output from the readout circuit unit 50 to the outside of the photoelectric conversion device 100. The external interface circuit included in the output circuit unit 70 is not particularly limited. As the external interface circuit, for example, SerDes (SERializer/DESerializer) transmission circuits such as LVDS (Low Voltage Differential Signaling) circuits and SLVS (Scalable Low Voltage Signaling) circuits may be applied.

The control pulse generation unit 80 is a control circuit configured to generate a control signal for controlling the operation and timing of the vertical scanning circuit unit 40, the readout circuit unit 50, and the horizontal scanning circuit unit 60, and supply the control signal to each functional block. At least a part of the control signals for controlling the operation and timing of the vertical scanning circuit unit 40, the readout circuit unit 50, and the horizontal scanning circuit unit 60 may be supplied from the outside of the photoelectric conversion device 100.

Note that the connection mode of each functional block of the photoelectric conversion device 100 is not limited to the configuration example illustrated in FIG. 1, and may be configured as illustrated in FIG. 2, for example.

In the configuration example of FIG. 2, the data line 16 extending in the first direction is arranged in each row of the pixel array of the pixel unit 10. Each of the data lines 16 is connected to the pixels 12 aligned in the first direction, and forms a signal line common to these pixels 12. The control line 18 extending in the second direction is arranged in each column of the pixel array of the pixel unit 10. Each of the control lines 18 is connected to the pixels 12 aligned in the second direction, and forms a signal line common to these pixels 12.

The control line 18 in each column is connected to the horizontal scanning circuit unit 60. The horizontal scanning circuit unit 60 receives a control signal output from the control pulse generation unit 80, generates a control signal for reading out the pixel signals from the pixels 12, and supplies the control signal to the pixels 12 via the control line 18. Specifically, the horizontal scanning circuit unit 60 sequentially scans the plurality of pixels 12 in the pixel unit 10 column by column to thereby output pixel signals of the pixels 12 of each row belonging to the selected column to the data lines 16.

The data line 16 in each row is connected to the readout circuit unit 50. The readout circuit unit 50 includes a plurality of holding units (not illustrated) provided corresponding to respective rows of the pixel array of the pixel unit 10, and has a function of holding pixel signals of the pixels 12 of respective rows output from the pixel unit 10 via the data lines 16 in units of columns in the holding units of corresponding rows.

The readout circuit unit 50 receives the control signal output from the control pulse generation unit 80, and sequentially outputs the pixel signals held in the holding unit of each row to the output circuit unit 70.

Other configurations in the configuration example of FIG. 2 may be the same as those in the configuration example of FIG. 1.

As illustrated in FIG. 3, each pixel 12 includes a photoelectric conversion unit 20 and a pixel signal processing unit 30. The photoelectric conversion unit 20 includes a photon detection element 22 and a quenching element 24. The pixel signal processing unit 30 includes a signal processing circuit 32, a counter 34, and a pixel output circuit 36.

The photon detection element 22 may be an avalanche photodiode (hereinafter referred to as "APD"). The anode of the APD constituting the photon detection element 22 is connected to a node to which a voltage VL is supplied. The cathode of the APD constituting the photon detection element 22 is connected to one terminal of the quenching element 24. A connection node between the photon detection element 22 and the quenching element 24 is an output node of the photoelectric conversion unit 20. The other terminal of the quenching element 24 is connected to a node to which a voltage VH higher than the voltage VL is supplied. The voltage VL and the voltage VH are set such that a reverse bias voltage sufficient for the APD to perform an avalanche multiplication operation is applied. In one example, a negative high voltage is applied as the voltage VL, and a positive voltage approximately equal to the power supply voltage is applied as the voltage VH. For example, the voltage VL is −30V and the voltage VH is 1V.

The photon detection element 22 may be comprised of an APD as described above. When a reverse bias voltage sufficient to perform the avalanche multiplication operation is supplied to the APD, charges generated by light incidence on the APD cause avalanche multiplication, and an avalanche current is generated. Operation modes in a state where a reverse bias voltage is supplied to the APD include a Geiger mode and a linear mode. The Geiger mode is an operation mode in which a voltage applied between the anode and the cathode is set to a reverse bias voltage higher than the breakdown voltage of the APD. The linear mode is an operation mode in which a voltage applied between the anode and the cathode is set to a reverse bias voltage close to or lower than the breakdown voltage of the APD. The APD operating in the Geiger mode is called SPAD (Single Photon Avalanche Diode). The APD constituting the photon detection element 22 may operate in a linear mode or in a Geiger mode. In particular, SPAD is preferable because the potential difference becomes large and the effect of withstand voltage becomes significant as compared with the linear mode APD.

The quenching element 24 has a function of converting a change in the avalanche current generated in the photon detection element 22 into a voltage signal. The quenching element 24 functions as a load circuit (quenching circuit) at the time of signal multiplication by avalanche multiplication, and has a function of reducing the voltage applied to the photon detection element 22 to suppress avalanche multiplication. The operation in which the quenching element 24 suppresses the avalanche multiplication is called a quenching operation. Further, the quenching element 24 has a function of returning the voltage supplied to the photon detection element 22 to the voltage VH by flowing the current corresponding to the voltage drop caused by the quenching operation. The operation in which the quenching element 24 returns the voltage supplied to the photon detection element 22 to the voltage VH is called a recharging operation. The quenching element 24 may be formed of a resistor, a MOS transistor, or the like.

The signal processing circuit 32 has an input node to which a signal IN1, which is an output signal of the photoelectric conversion unit 20, is supplied, an input node to which a signal IN2 is supplied, and an output node. The signal processing circuit 32 functions as a waveform shaping unit that converts the signal IN1, which is an analog signal supplied from the photoelectric conversion unit 20, into a pulse signal. The signal IN2 is a selection signal that is supplied from the control pulse generation unit 80 and selects whether or not to output a pulse signal corresponding to the signal IN1 from the output node. The output node of the signal processing circuit 32 is connected to the counter 34.

The counter 34 has an input node to which a signal OUT, which is an output signal of the signal processing circuit 32, is supplied, an input node connected to the control line 14, and an output node. The counter 34 has a function of counting pulses superimposed on the signal OUT output from the signal processing circuit 32 and holding a count value as a counting result. The signal supplied from the vertical scanning circuit unit 40 to the counter 34 via the control line 14 may include an enable signal for controlling the pulse counting period (exposure period), a reset signal for resetting the count value held by the counter 34, and the like. The output node of the counter 34 is connected to the data line 16 via the pixel output circuit 36.

The pixel output circuit 36 has a function of switching an electrical connection state (connection or disconnection) between the counter 34 and the data line 16. The pixel output circuit 36 switches the connection state between the counter 34 and the data line 16 in response to a control signal supplied from the vertical scanning circuit unit 40 via the control line 14 (a control signal supplied from the horizontal scanning circuit unit 60 via the control line 18 in the configuration example of FIG. 2). The pixel output circuit 36 may include a buffer circuit for outputting a signal.

The pixel 12 is typically a unit structure that outputs a pixel signal for forming an image. However, when the purpose is to perform, e.g., a distance measurement using a TOF (Time of Flight) method, the pixels 12 need not necessarily be a unit structure that outputs a pixel signal for forming an image. That is, the pixel 12 may be a unit structure that outputs a signal for measuring the time at which light reaches and the amount of light.

Note that one pixel signal processing unit 30 is not necessarily provided for each pixel 12, and one pixel signal processing unit 30 may be provided for a plurality of pixels 12. In this case, signal processing of the plurality of pixels 12 may be sequentially executed using one pixel signal processing unit 30.

The photoelectric conversion device 100 according to the present embodiment may be formed on one substrate, or may be formed as a stacked photoelectric conversion device in which a plurality of substrates is stacked. In the latter case, for example, as illustrated in FIG. 4, the photoelectric conversion device may be configured as a stacked-type photoelectric conversion device in which the sensor substrate 110 and the circuit substrate 120 are stacked and electrically connected. In the sensor substrate 110, at least the photon detection element 22 among the components of the pixel 12 may be arranged. Among the components of the pixel 12, the quenching element 24 and the pixel signal processing unit 30 may be arranged on the circuit substrate 120. The photon detection element 22, the quenching element 24, and the pixel signal processing unit 30 are electrically connected to each other via an interconnection provided for each pixel 12. The circuit substrate 120 may further include a vertical scanning circuit unit 40, a readout circuit unit 50, a horizontal scanning circuit unit 60, an output circuit unit 70, a control pulse generation unit 80, and the like.

The photon detection element 22, and the quenching element 24 and the pixel signal processing unit 30 of each pixel 12 are provided on the sensor substrate 110 and the circuit substrate 120, respectively so as to overlap each other in a plan view. The vertical scanning circuit unit 40, the readout circuit unit 50, the horizontal scanning circuit unit 60, the output circuit unit 70, and the control pulse generation unit 80 may be arranged around the pixel unit 10 including the plurality of pixels 12.

In this specification, "plan view" refers to viewing from a direction perpendicular to the light incident surface of the sensor substrate 110. The "cross section" refers to a cross section in a direction perpendicular to the light incident surface of the sensor substrate 110.

By configuring the stacked-type photoelectric conversion device 100, integration degree of the elements may be increased and high functions may be achieved. In particular, by arranging the photon detection element 22, and the quenching element 24 and the pixel signal processing unit 30 on different substrates, the photon detection elements 22 may be arranged at high density without sacrificing the light receiving area of the photon detection element 22, and the photon detection efficiency may be improved.

Note that the number of substrates constituting the photoelectric conversion device 100 is not limited to two, and the photoelectric conversion device 100 may be formed by stacking three or more substrates.

Although a chip diced is assumed as the sensor substrate 110 and the circuit substrate 120 in FIG. 4, the sensor substrate 110 and the circuit substrate 120 are not limited to the chip. For example, each of the sensor substrate 110 and the circuit substrate 120 may be a wafer. In addition, the sensor substrate 110 and the circuit substrate 120 may be diced after being stacked in a wafer state, or may be stacked and bonded after being formed into chips.

FIG. 5A to FIG. 5C illustrate basic operations of the photoelectric conversion unit 20 and the signal processing circuit 32. FIG. 5A is a circuit diagram of the photoelectric conversion unit 20 and the signal processing circuit 32, FIG. 5B illustrates a waveform of a signal at an input node (node A) of the signal processing circuit 32, and FIG. 5C illustrates a waveform of a signal at an output node (node B) of the signal processing circuit 32. Here, for simplicity of description, it is assumed that the signal processing circuit 32 is configured by an inverter circuit.

At time t0, a reverse bias voltage having a potential difference corresponding to (VH−VL) is applied to the photon detection element 22. Although a reverse bias voltage sufficient to cause avalanche multiplication is applied between the anode and the cathode of the APD constituting the photon detection element 22, no carrier is present as a seed of avalanche multiplication in a state where photons are not incident on the photon detection element 22. Therefore, avalanche multiplication does not occur in the photon detection element 22, and no current flows in the photon detection element 22.

At subsequent time t1, it is assumed that a photon is incident on the photon detection element 22. When the photon enters the photon detection element 22, electron-hole pair is generated by photoelectric conversion, and avalanche multiplication occurs using these carriers as seeds, and an avalanche multiplication current flows through the photon detection element 22. When the avalanche multiplication current flows through the quenching element 24, a voltage drop is caused by the quenching element 24, and the voltage of the node A begins to drop. When the voltage drop amount of the node A increases and the avalanche multiplication is stopped at time t3, the voltage level of the node A does not drop further.

When the avalanche multiplication in the photon detection element 22 is stopped, a current that compensates for the voltage drop flows from the node to which the voltage VL is supplied to the node A via the photon detection element 22, and the voltage of the node A gradually increases. Thereafter, at time t5, the node A is settled to the original voltage level.

The signal processing circuit 32 binarizes the signal input from the node A in accordance with a predetermined determination threshold value, and outputs the binarized signal from the node B. More specifically, the signal processing circuit 32 outputs a Low-level signal from the node B when the voltage level of the node A exceeds the determination threshold value, and outputs a High-level signal from the node B when the voltage level of the node A is equal to or lower than the determination threshold value. For example, as illustrated in FIG. 5B, it is assumed that the voltage of the node A is equal to or lower than the determination threshold value during a period from time t2 to time t4. In this case, as illustrated in FIG. 5C, the signal level at the node B becomes Low level during the period from time t0 to time t2 and the period from time t4 to time t5, and becomes High-level during the period from time t2 to time t4.

Thus, the analog signal input from the node A is shaped into a digital signal by the signal processing circuit 32. A pulse signal output from the signal processing circuit 32 in response to an incident of photon on the photon detection element 22 is a photon detection pulse signal.

Figure 6A:
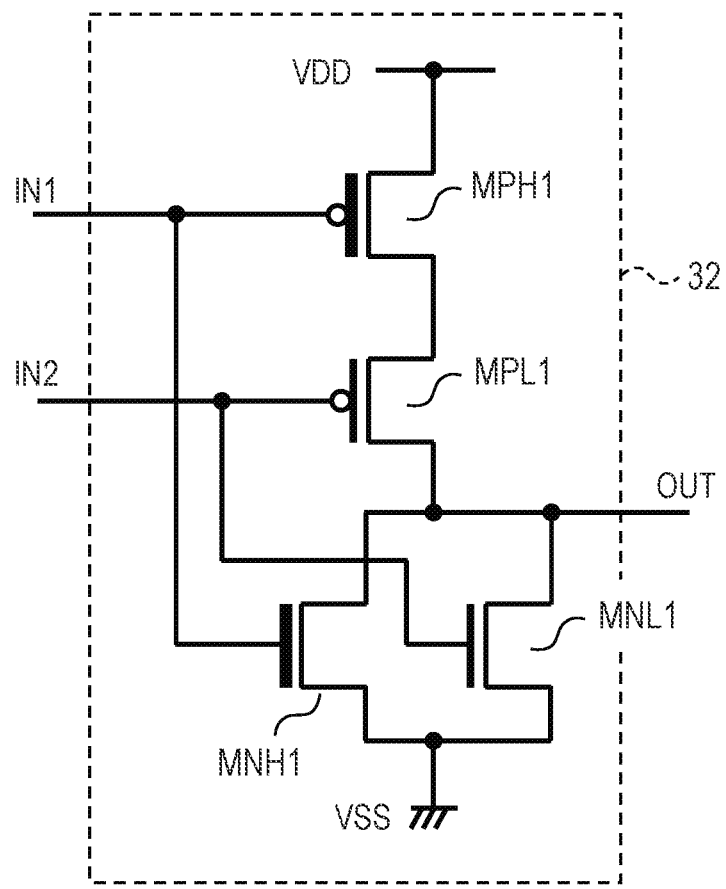
FIG. 6A and FIG. 6B are diagrams illustrating a configuration example and an operation of a signal processing circuit in the photoelectric conversion device according to the first embodiment (Part 1).
Figure 6B:
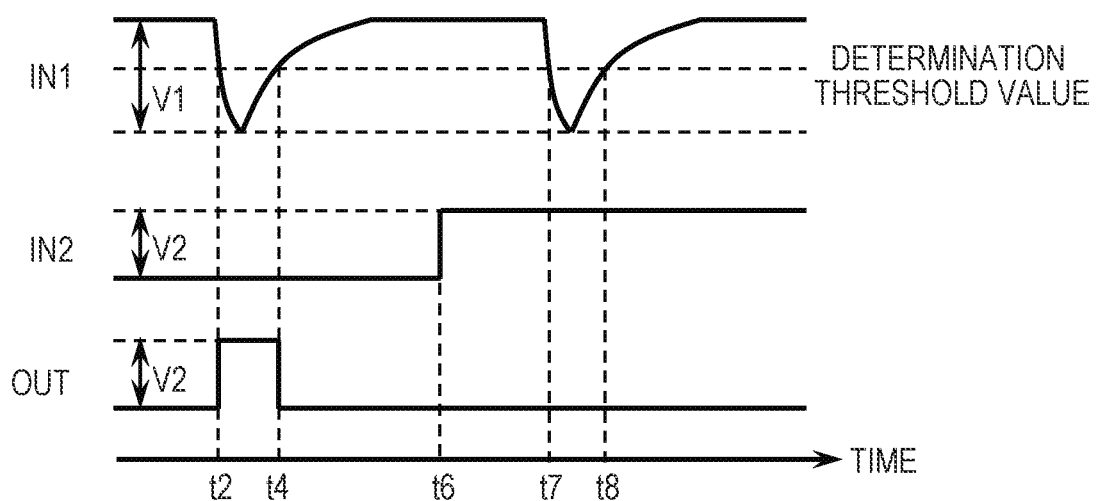

FIG. 6A and FIG. 6B are diagrams illustrating a configuration example and an operation of the signal processing circuit 32. FIG. 6A is a circuit diagram illustrating a configuration example of the signal processing circuit 32, and FIG. 6B illustrates waveforms of input signals (signals IN1 and IN2) and an output signal (signal OUT) of the signal processing circuit 32.

For example, as illustrated in FIG. 6A, the signal processing circuit 32 may be configured by a two-input NOR circuit including n-channel transistors MNH1 and MNL1 and p-channel transistors MPH1 and MPL1. The input node to which the signal IN1 is supplied is connected to the gate of the n-channel transistor MNH1 and the gate of the p-channel transistor MPH1. The input node to which the signal IN2 is supplied is connected to the gate of the n-channel transistor MNL1 and the gate of the p-channel transistor MPL1. The source of the p-channel transistor MPH1 is connected to a power supply voltage node (voltage VDD). The drain of the p-channel transistor MPH1 is connected to the source of the p-channel transistor MPL1. The drain of the p-channel transistor MPL1 is connected to the drain of the n-channel transistor MNH1 and the drain of the n-channel transistor MNL1. The source of the n-channel transistor MNH1 and the source of the n-channel transistor MNL1 are connected to a reference voltage node (voltage VSS). A connection node between the drain of the p-channel transistor MPL1, the drain of the n-channel transistor MNH1, and the drain of the n-channel transistor MNL1 forms an output node of the signal processing circuit 32.

As illustrated in FIG. 6B, the signal processing circuit 32 illustrated in FIG. 6A configured by a two-input NOR circuit outputs a photon detection pulse signal in response to an incident of photon on the photon detection element 22 when the signal IN2 is at a Low level. On the other hand, when the signal IN2 is at the High-level, the signal processing circuit 32 does not output the photon detection pulse signal even if a photon enters the photon detection element 22.

Here, the signal processing circuit 32 of the photoelectric conversion device 100 according to the present embodiment includes an element having a relatively high withstand voltage (high withstand voltage transistor) and an element having a relatively low withstand voltage (low withstand voltage transistor). Specifically, the n-channel transistor MNH1 and the p-channel transistor MPH1 which receive the signal IN1 at the control node (gate) are configured by high withstand voltage transistors. The n-channel transistor MNL1 and the p-channel transistor MPL1 which receive the signal IN2 at the control node (gate) are configured by low withstand voltage transistors. Note that the high withstand voltage transistor may be, for example, a 2.5V system transistor assuming operation at a power supply voltage of 2.5V. Further, the low withstand voltage transistor may be, for example, a 1.1V type transistor assuming an operation at a power supply voltage of 1.1V.

The logic circuit constituting the counter 34, the pixel output circuit 36, and the like is preferably constituted by a transistor capable of low power consumption and high-speed operation, but the transistor having such characteristics is a low withstand voltage transistor having a relatively low withstand voltage. On the other hand, the signal IN1 output from the photoelectric conversion unit 20 has a predetermined amplitude (voltage V1) corresponding to the operation of the photoelectric conversion unit 20. Since the voltage V1 is normally larger than the amplitude (voltage V2) of the internal signal of the logic circuit and exceeds the gate breakdown voltage of the low withstand voltage transistor, the low withstand voltage transistor cannot receive the signal IN1. Therefore, the signal processing circuit 32 is formed of a high withstand voltage transistor having a withstand voltage higher than the voltage V1.

However, since the high withstand voltage transistor has a larger occupied area than the low withstand voltage transistor, when the signal processing circuit 32 is formed of the high withstand voltage transistor, the circuit area increases. In particular, since the SPAD image sensor has a larger number of elements per pixel than the CMOS image sensor, it is desirable to reduce the area of the signal processing circuit 32 as much as possible.

Therefore, in the present embodiment, the n-channel transistor MNH1 and the p-channel transistor MPH1 receiving the signal IN1 are configured by high withstand voltage transistors, while the n-channel transistor MNL1 and the p-channel transistor MPL1 receiving the signal IN2 are configured by low withstand voltage transistors. With such a configuration, the high withstand voltage transistor may be narrowed down to a necessary minimum, and the signal processing circuit 32 having a withstand voltage with respect to the voltage V1 may be realized in a small area. This makes it possible to widen the spacing between elements and reduce interference between signals. Alternatively, the number of elements that may be incorporated in the pixels 12 having the same area may be increased, and the photoelectric conversion device may be improved in function.

FIG. 6A and FIG. 6B illustrate an example in which the signal processing circuit 32 is configured by a two-input NOR circuit, but the signal processing circuit 32 is not limited to a two-input NOR circuit. For example, as illustrated in FIG. 7A, the signal processing circuit 32 may be configured by a two-input one-output logic circuit including an inverter circuit and a NAND circuit. The signal processing circuit 32 illustrated in FIG. 7A includes a NOT circuit (inverter circuit) including an n-channel transistor MNH2 and a p-channel transistor MPH2, and a NAND circuit including n-channel transistors MNH1 and MNL1 and p-channel transistors MPH1 and MPL1.

The input node to which the signal IN1 is supplied is connected to the gate of the n-channel transistor MNH2 and the gate of the p-channel transistor MPH2. The source of the p-channel transistor MPH2 is connected to a power supply voltage node (voltage VDH). The drain of the p-channel transistor MPH2 is connected to the drain of the n-channel transistor MNH2. The source of the n-channel transistor MNH2 is connected to a reference voltage node (voltage VSS). A connection node (node N1) between the drain of the p-channel transistor MPH2 and the drain of the n-channel transistor MNH2 is an output node of the inverter circuit. The signal amplitude at the node N1 is the voltage V1. The potential difference between the voltage VDH and the voltage VS S is approximately the voltage V1.

The node N1 is connected to the gate of the n-channel transistor MNH1 and the gate of the p-channel transistor MPH1. The input node to which the signal IN2 is supplied is connected to the gate of the n-channel transistor MNL1 and the gate of the p-channel transistor MPL1. The source of the p-channel transistor MPH1 and the source of the p-channel transistor MPL1 are connected to a power supply voltage node (voltage VDD). The drain of the p-channel transistor MPH1 and the drain of the p-channel transistor MPL1 are connected to the drain of the n-channel transistor MNH1. The source of the n-channel transistor MNH1 is connected to the drain of the n-channel transistor MNL1. The source of the n-channel transistor MNL1 is connected to a reference voltage node (voltage VSS). A connection node between the drain of the p-channel transistor MPH1, the drain of the p-channel transistor MPL1, and the drain of the n-channel transistor MNH1 forms an output node of the signal processing circuit 32.

Figure 7B:
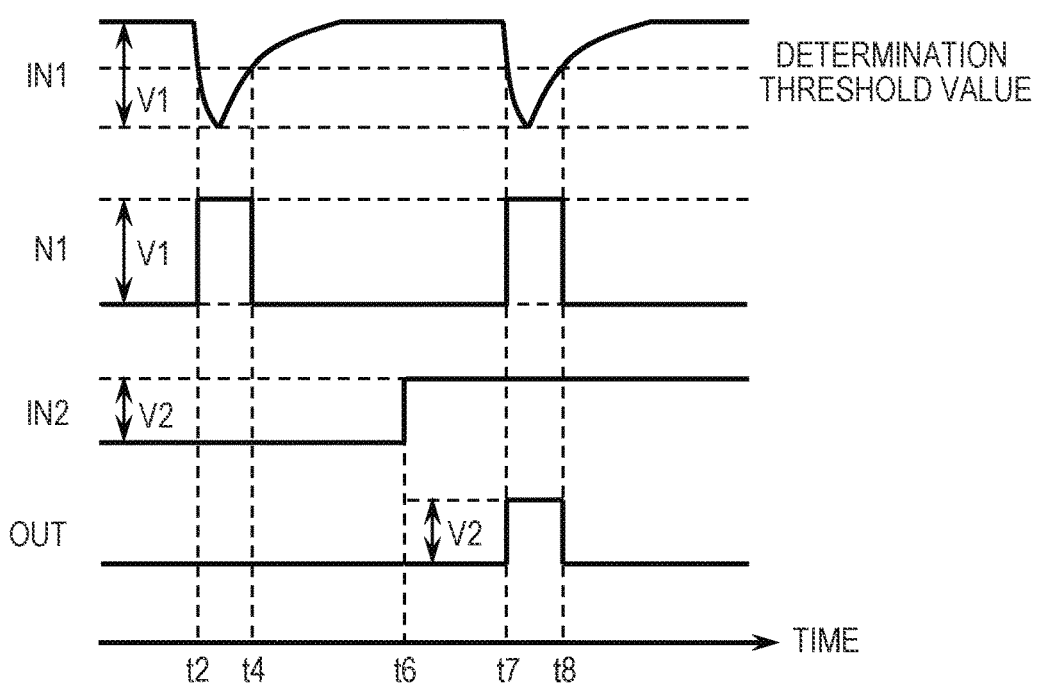

As illustrated in FIG. 7B, the signal processing circuit 32 constituted by the circuit of FIG. 7A outputs a photon detection pulse signal in response to an incident of photon on the photon detection element 22 when the signal IN2 is at High-level. On the other hand, when the signal IN2 is at the Low-level, the signal processing circuit 32 does not output the photon detection pulse signal even if a photon enters the photon detection element 22.

The n-channel transistors MNH1 and MNL1 and the p-channel transistors MPH1 and MPL1 in FIG. 7A may be configured by low withstand voltage transistors, and the voltage VDD may be supplied to the source of the p-channel transistor MPH2 of the NOT circuit.

Although the two-input signal processing circuit 32 is illustrated in FIG. 6A to FIG. 7B, the signal processing circuit 32 is not limited to two inputs and may be a signal processing circuit 32 having three or more input nodes.

FIG. 8 is a plan view illustrating an example of arrangement of elements constituting the pixel unit 10 on the circuit substrate 120. FIG. 8 illustrates four pixels 12 arranged in two rows×two columns among the plurality of pixels 12 provided in the pixel unit 10. The pixel unit 10 is formed by repeatedly arranging the unit blocks including the four pixels 12 in the row direction and the column direction. In FIG. 8, only the pattern of the active region, the pattern of the gate layer, and the pattern of the n-well 134 and the p-well 136 are illustrated for simplification of the drawing. A boundary between the n-well 134 and the p-well 136 is indicated by a broken line, and a dot pattern is attached to a region of the p-well 136. In addition, a boundary between a region in which the low withstand voltage transistor is provided (low withstand voltage region LV) and a region in which the high withstand voltage transistor is provided (high withstand voltage region HV) is illustrated by a one-dot-chain line.

The circuit substrate 120 is provided with elements other than the photon detection element 22 among the elements constituting the pixel 12, specifically, the quenching element 24, and the transistors constituting the signal processing circuit 32, the counter 34, and the pixel output circuit 36. In FIG. 8, the p-channel transistor MPQ constituting the quenching element 24 and the n-channel transistors MNH1 and MNL1 and the p-channel transistors MPH1 and MPL1 constituting the signal processing circuit 32 are denoted by corresponding reference numerals. The other transistors not denoted by reference numerals are the transistors constituting the counter 34 and the pixel output circuit 36. Although specific transistors are designated as the n-channel transistor MNL1 and the p-channel transistor MPL1 in FIG. 8, the n-channel transistor MNL1 and the p-channel transistor MPL1 are not particularly limited as long as they are transistors arranged in the low withstand voltage region LV.

Among the transistors constituting the quenching element 24 and the signal processing circuit 32, the n-channel transistor MNH1 and the p-channel transistors MPH1 and MPQ are high withstand voltage transistors, and the n-channel transistor MNL1 and the p-channel transistor MPL1 are low withstand voltage transistors. The n-channel transistor MNH1 and the p-channel transistors MPH1 and MPQ are arranged in the high withstand voltage region HV, and the n-channel transistor MNL1 and the p-channel transistor MPL1 are arranged in the low withstand voltage region LV. The high withstand voltage transistor and the low withstand voltage transistor are arranged at predetermined intervals from the viewpoint of ensuring a misalignment margin and a withstand voltage caused by a different manufacturing process.

In the arrangement example of FIG. 8, the four pixels 12 of 2 rows×2 columns are arranged in mirror symmetry, and the high withstand voltage regions HV of the four pixels 12 are arranged so as to be adjacent to each other. In other words, the four pixels 12 share one region formed by the high withstand voltage regions HV of the four pixels 12. Thus, the boundary between the high withstand voltage region HV and the low withstand voltage region LV in each pixel 12 may be reduced, and the area efficiency may be improved. Therefore, complex circuits such as the signal processing circuit 32, the counter 34, and the pixel output circuit 36 may be applied to realize a higher functionality of the photoelectric conversion device.

Although FIG. 8 illustrates an example in which two sides of the high withstand voltage region HV are in contact with the high withstand voltage region HV of adjacent pixels 12, the number of sides in contact with the high withstand voltage region HV of adjacent pixels 12 may be one or three.

In the arrangement example of FIG. 8, the direction in which the gate of the p-channel transistor MPQ extends (X direction) is orthogonal to the direction in which the gates of the n-channel transistor MNH1 and the p-channel transistor MPH1 extend (Y direction). Thus, the area efficiency may be improved as compared with the case where the direction in which the gate of the p-channel transistor MPQ extends and the direction in which the gates of the n-channel transistor MNH1 and the p-channel transistor MPH1 extend are arranged in the same direction (X direction) (see FIG. 9A and FIG. 9B). The direction in which the gate of each transistor extends may be selected as appropriate from the viewpoint of area improvement or the like.

As illustrated in FIG. 8, the n-channel transistor MNH1, which is a high withstand voltage transistor, and the n-channel transistor MNL1, which is a low withstand voltage transistor, may be arranged in a common p-well 136. Similarly, the p-channel transistors MPH1 and MPQ which are high withstand voltage transistors and the p-channel transistor MPL1 which is a low withstand voltage transistor may be arranged in a common n-well 134.

FIG. 10 is a plan view illustrating a part of elements of one pixel 12 extracted from FIG. 8. FIG. 11 is a cross-sectional view taken along line A-A' of FIG. 10. In FIG. 10 and FIG. 11, the n-channel transistor MNL is a low withstand voltage transistor having the same structure as the n-channel transistor MNL1, and the p-channel transistor MPL is a low withstand voltage transistor having the same structure as the p-channel transistor MPL1.

An n-well 134 and a p-well 136 are provided in a surface portion of the silicon substrate 130. An element isolation region 132 that defines active regions is provided in a surface portion of the silicon substrate 130. The n-channel transistors MNH1, MNL1, MNL, and a p-well contact portion 154 are provided in the active regions defined in the p-well 136. In the active regions defined in the n-well 134, p-channel transistors MPH1, MPL1, and MPL, and an n-well contact portion 156 are provided. Alternatively, the n-well 134 may have a double well structure surrounded by a p-type region, and the n-well 134 may be electrically isolated from a deep portion of the silicon substrate 130.

Each of the n-channel transistors MNL1 and MNL includes a gate electrode 146 provided over the silicon substrate 130 with a gate insulating film 142 interposed therebetween, and source/drain regions 150 formed of n-type semiconductor regions. Each of the p-channel transistors MPL1 and MPL includes a gate electrode 146 provided over the silicon substrate 130 with a gate insulating film 142 interposed therebetween, and source/drain regions 152 formed of p-type semiconductor regions. The n-channel transistor MNH1 includes a gate electrode 148 provided over the silicon substrate 130 with a gate insulating film 144 interposed therebetween, and source/drain regions 150 formed of n-type semiconductor regions. The p-channel transistor MPH1 includes a gate electrode 148 provided over the silicon substrate 130 with a gate insulating film 144 interposed therebetween, and source/drain regions 152 formed of p-type semiconductor regions.

The high withstand voltage n-channel transistor MNH1 and the low withstand voltage n-channel transistor MNL1 share a p-well contact portion 154. The p-well contact portion 154 is formed of a high-concentration p-type semiconductor region provided in the surface portion of the p-well 136. The high withstand voltage p-channel transistor MPH1 and the low withstand voltage p-channel transistors MPL1 and MPL share an n-well contact portion 156. The n-well contact portion 156 is formed of a high-concentration n-type semiconductor region provided in the surface portion of the n-well 134.

The low withstand voltage transistor (n-channel transistors MNL1, MNL and p-channel transistors MPL1, MPL) and the high withstand voltage transistor (n-channel transistor MNH1 and p-channel transistor MPH1) have different thicknesses of the gate insulating films 142 and 144. Specifically, the gate insulating film 144 of the high withstand voltage transistor is thicker than the gate insulating film 142 of the low withstand voltage transistor.

Next, an example of a method for manufacturing the low withstand voltage transistor and the high withstand voltage transistor will be described with reference to FIG. 12A to FIG. 12F. FIG. 12A to FIG. 12F are cross-sectional views illustrating a method of manufacturing the low withstand voltage transistor and the high withstand voltage transistor.

First, an element isolation region 132 that defines active regions is formed in a surface portion of a silicon substrate 130 by, for example, STI (Shallow Trench Isolation) method.

Figure 12A:
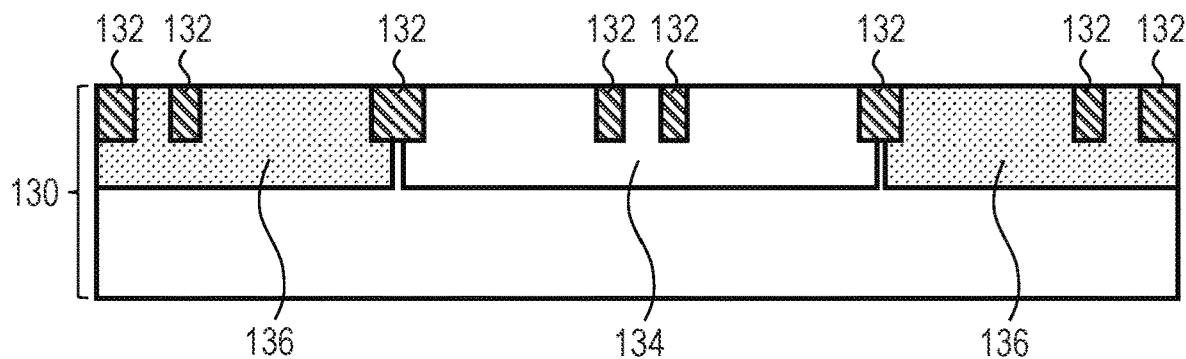
FIG. 12A, FIG. 12B, FIG. 12C, FIG. 12D, FIG. 12E, and FIG. 12F are cross-sectional views illustrating a method of manufacturing a high withstand voltage transistor and a low withstand voltage transistor used in the photoelectric conversion device according to the first embodiment.

Next, predetermined impurities are implanted into predetermined regions of the silicon substrate 130 by using photolithography and ion implantation to form an n-well 134 and a p-well 136 (FIG. 12A).

Figure 12B:
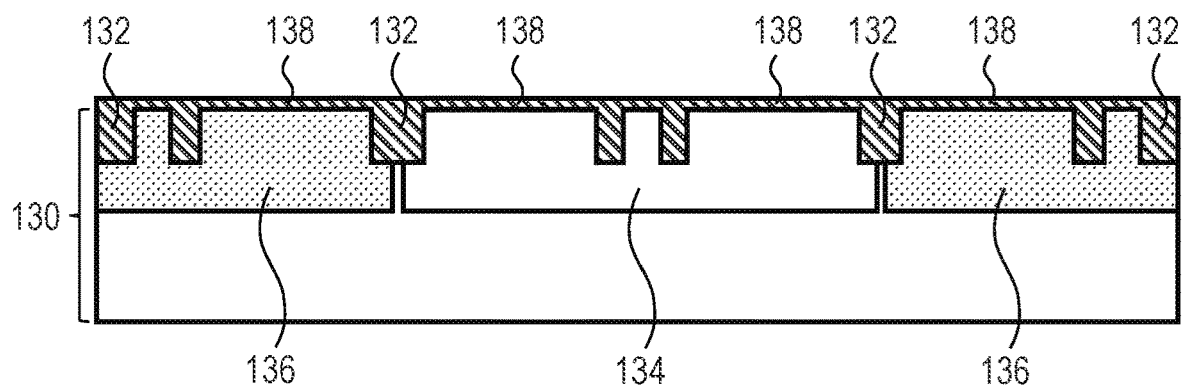

Next, the silicon substrate 130 is thermally oxidized by, for example, a thermal oxidation method to form a silicon oxide film 138 on the surface portions of the active regions defined by the element isolation region 132 (FIG. 12B).

Next, a photoresist film 140 covering at least the high withstand voltage region HV and exposing at least the low withstand voltage region LV is formed by photolithography.

Figure 12C:
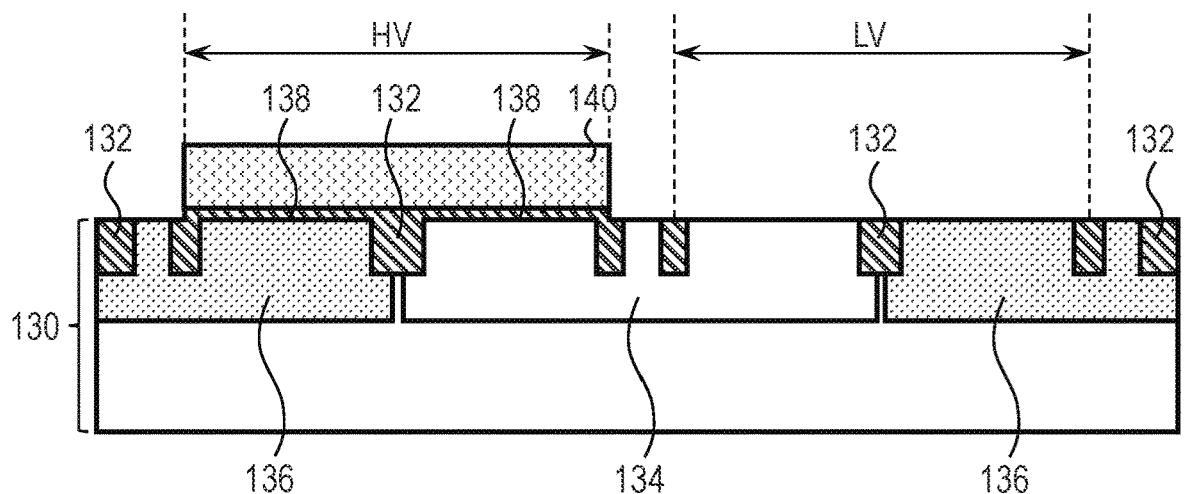

Next, the silicon oxide film 138 is etched by using the photoresist film 140 as a mask to remove the silicon oxide film 138 in the low withstand voltage region LV (FIG. 12C). In FIG. 12C, the silicon oxide film 138 in the well contact region may be also removed together with the silicon oxide film 138 in the low withstand voltage region LV, but the silicon oxide film 138 in the well contact region is not necessarily removed.

Next, the photoresist film 140 is removed by ashing method, for example.

Figure 12D:
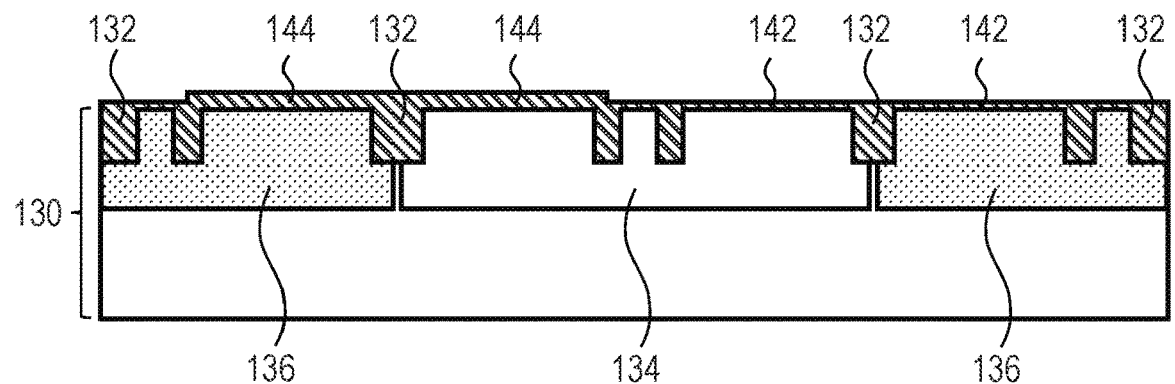

Next, the silicon substrate 130 is thermally oxidized by, for example, a thermal oxidation method to form a silicon oxide film (gate insulating film 142) having a first thickness in the low withstand voltage region LV and the well contact region. At the same time, the silicon oxide film 138 in the high withstand voltage region HV is additionally oxidized to form a silicon oxide film (gate insulating film 144) having a second thickness thicker than the first thickness (FIG. 12D).

Figure 12E:
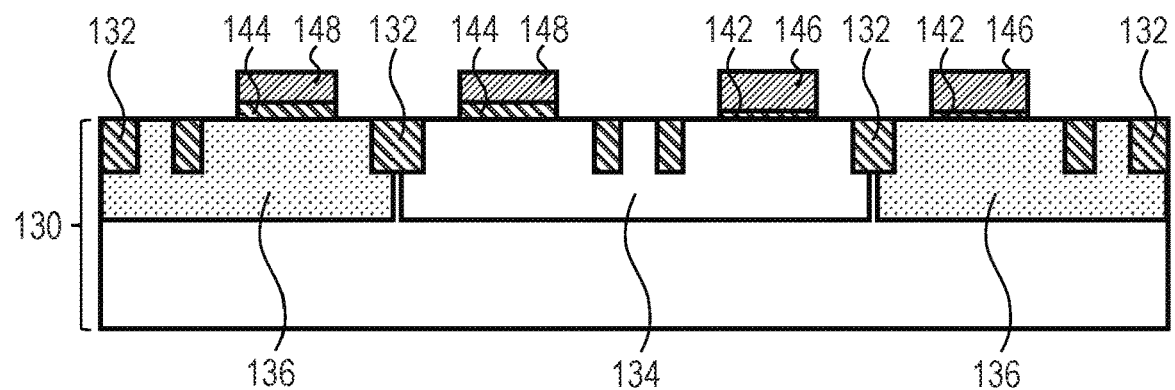

Next, a polycrystalline silicon film is deposited by, e.g., CVD method, and then the polycrystalline silicon film is patterned by using photolithography and dry etching to form gate electrodes 146 and 148 (FIG. 12E).

Next, n-type impurities are implanted into the n-channel transistor forming region and the n-well contact region by using photolithography and ion implantation. Thus, source/drain regions 150 and n-well contact portions 156 of the n-channel transistors MNH1, MNL1, MNL are formed.

Figure 12F:
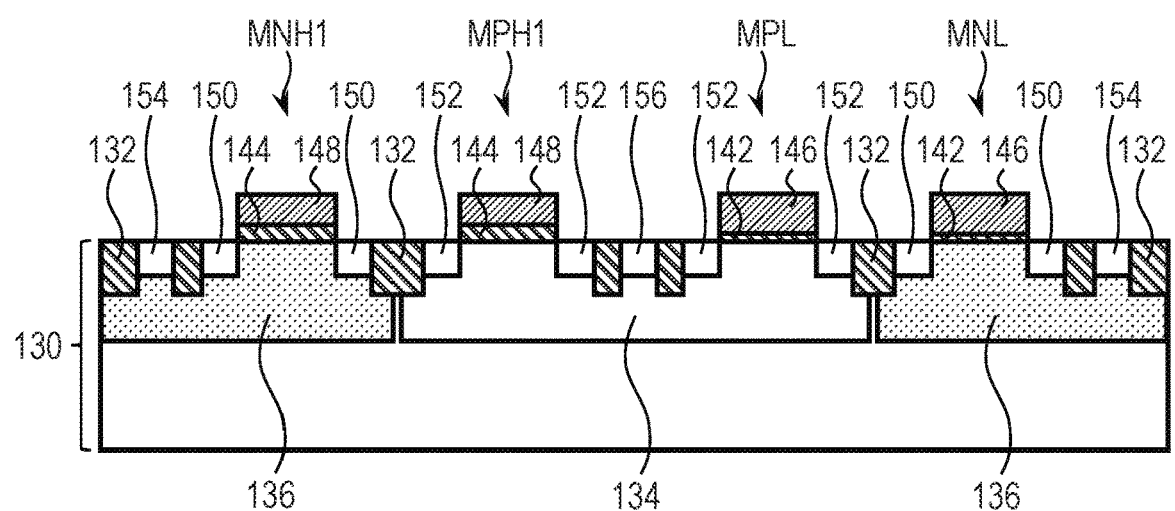

Further, a p-type impurities are implanted into the p-channel transistor forming region and the p-well contact region by using photolithography and ion implantation. Thus, source/drain regions 152 and p-well contact portions 154 of the p-channel transistors MPH1, MPL1, and MPL are formed (FIG. 12F).

As described above, according to the present embodiment, the area efficiency of the elements constituting the pixel circuit may be improved, and high performance and high functionality of the photoelectric conversion device may be realized.

Second Embodiment

Figure 13:
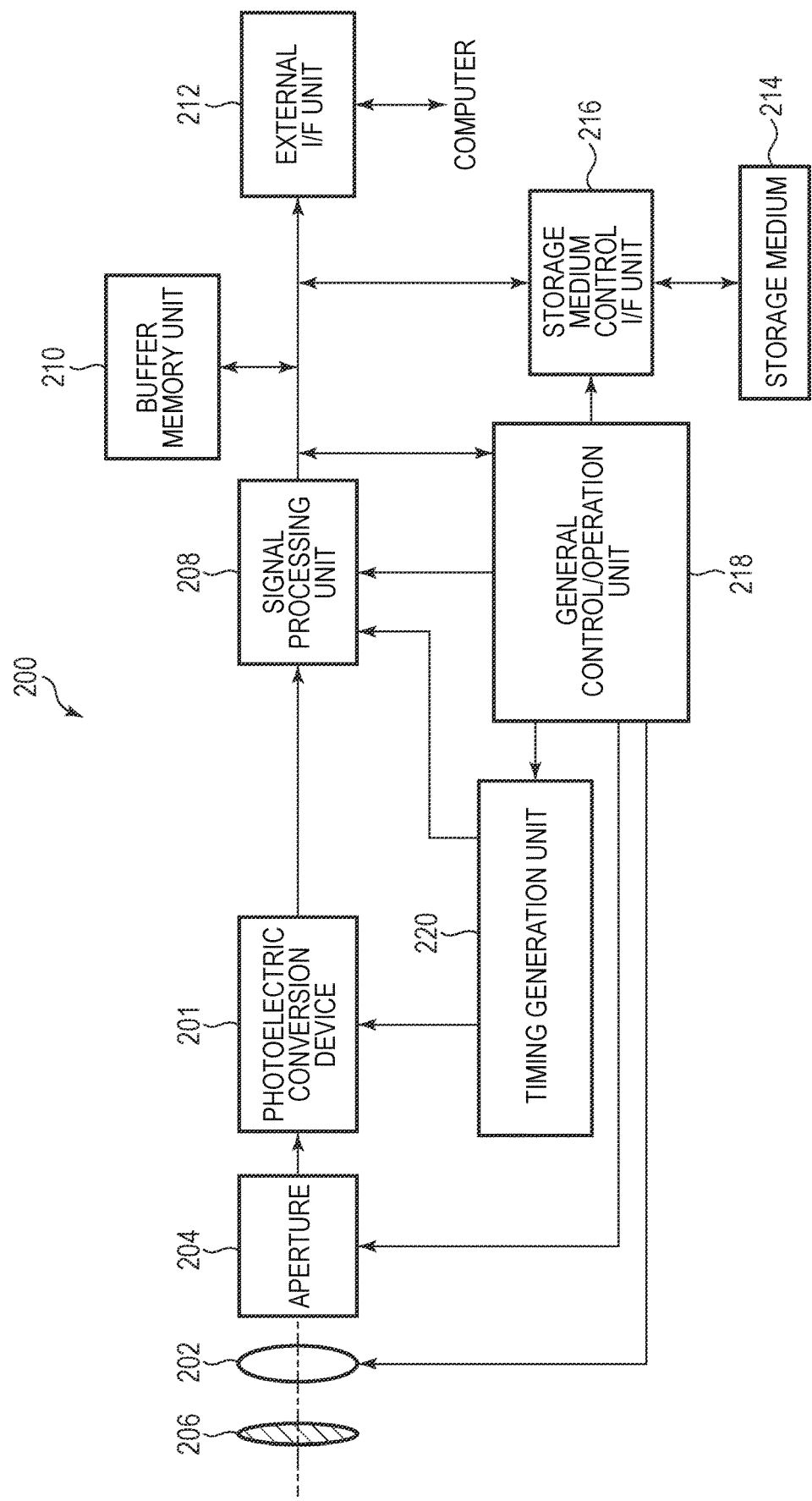
FIG. 13 is a block diagram illustrating a schematic configuration of a photodetection system according to a second embodiment.

A photodetection system according to a second embodiment will be described with reference to FIG. 13. FIG. 13 is a block diagram illustrating a schematic configuration of the photodetection system according to the present embodiment. In the present embodiment, a photodetection sensor to which the photoelectric conversion device 100 according to the first embodiment is applied will be described.

The photoelectric conversion device 100 described in the first embodiment is applicable to various photodetection systems. Examples of applicable photodetection systems include imaging systems such as digital still cameras, digital camcorders, surveillance cameras, copiers, facsimiles, cellular phones, in-vehicle cameras, and observation satellites. A camera module including an optical system such as a lens and an imaging device is also included in the photodetection system. FIG. 13 illustrates a block diagram of a digital still camera as an example of them.

The photodetection system 200 illustrated in FIG. 13 includes a photoelectric conversion device 201, a lens 202 for forming an optical image of an object onto the photoelectric conversion device 201, an aperture 204 for varying the amount of light passing through the lens 202, and a barrier 206 for protecting the lens 202. The lens 202 and the aperture 204 are optical systems for focusing light on the photoelectric conversion device 201. The photoelectric conversion device 201 is the photoelectric conversion device 100 described in the first embodiment, and converts an optical image formed by the lens 202 into image data.

The photodetection system 200 also includes a signal processing unit 208 that processes an output signal output from the photoelectric conversion device 201. The signal processing unit 208 generates image data from the digital signal output from the photoelectric conversion device 201. The signal processing unit 208 performs various types of correction and compression as necessary to output image data. The photoelectric conversion device 201 may include an AD conversion unit that generates a digital signal to be processed by the signal processing unit 208. The AD conversion unit may be formed on a semiconductor layer (semiconductor substrate) on which the photon detection element of the photoelectric conversion device 201 is formed, or may be formed on a semiconductor substrate different from the semiconductor layer on which the photon detection element of the photoelectric conversion device 201 is formed. The signal processing unit 208 may be formed on the same semiconductor substrate as the photoelectric conversion device 201.

The photodetection system 200 further includes a buffer memory unit 210 for temporarily storing image data, and an external interface unit (external I/F unit) 212 for communicating with an external computer or the like. The photodetection system 200 further includes a storage medium 214 such as a semiconductor memory for storing or read image data, and a storage medium control interface unit (recording medium control I/F unit) 216 for storing or reading out image data on or from the storage medium 214. The storage medium 214 may be built in the photodetection system 200 or may be detachable. Communication between the storage medium control I/F unit 216 and the storage medium 214 and communication from the external I/F unit 212 may be performed wirelessly.

The photodetection system 200 further includes a general control/operation unit 218 that controls various calculations and the entire digital still camera, and a timing generation unit 220 that outputs various timing signals to the photoelectric conversion device 201 and the signal processing unit 208. Here, the timing signal or the like may be input from the outside, and the photodetection system 200 may include at least the photoelectric conversion device 201 and the signal processing unit 208 that processes the output signal output from the photoelectric conversion device 201. The timing generation unit 220 may be mounted on the photoelectric conversion device 201. The general control/operation unit 218 and the timing generation unit 220 may be configured to perform part or all of the control functions of the photoelectric conversion device 201.

The photoelectric conversion device 201 outputs an imaging signal to the signal processing unit 208. The signal processing unit 208 performs predetermined signal processing on the imaging signal output from the photoelectric conversion device 201, and outputs image data. The signal processing unit 208 generates an image using the imaging signal. The signal processing unit 208 may be configured to perform distance measurement calculation on a signal output from the photoelectric conversion device 201.

As described above, according to the present embodiment, by configuring the photodetection system using the photoelectric conversion device of the first embodiment, it is possible to realize a photodetection system capable of acquiring images of higher quality.

Third Embodiment

Figure 14:
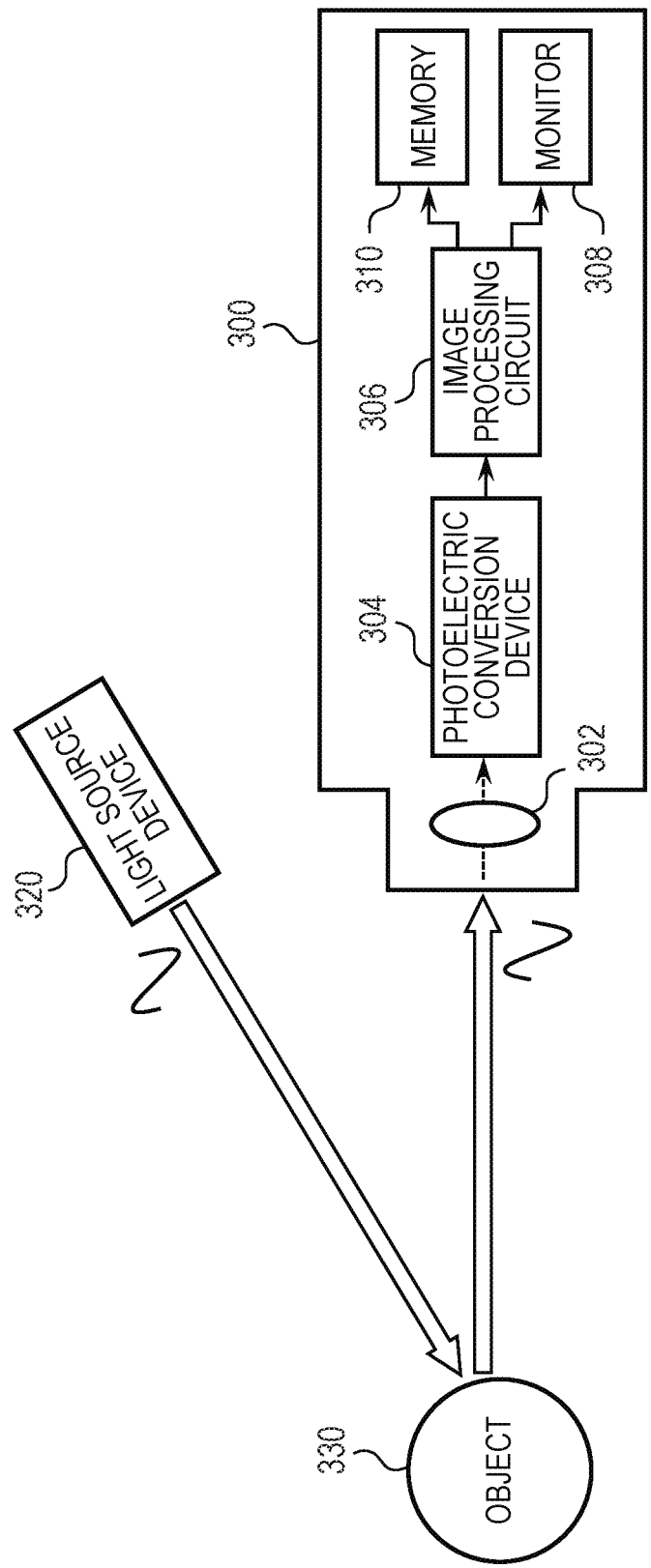
FIG. 14 is a block diagram illustrating a schematic configuration of a range image sensor according to a third embodiment.

A range image sensor according to a third embodiment will be described with reference to FIG. 14. FIG. 14 is a block diagram illustrating a schematic configuration of the range image sensor according to the present embodiment. In the present embodiment, a range image sensor will be described as an example of a photodetection system to which the photoelectric conversion device 100 according to the first embodiment is applied.

As illustrated in FIG. 14, the range image sensor 300 according to the present embodiment may include an optical system 302, a photoelectric conversion device 304, an image processing circuit 306, a monitor 308, and a memory 310. The range image sensor 300 receives light (modulated light or pulsed light) emitted from the light source device 320 toward an object 330 and reflected by the surface of the object 330, and acquires a distance image corresponding to the distance to the object 330.

The optical system 302 includes one or a plurality of lenses, and has a role of forming an image of image light (incident light) from the object 330 onto a light receiving surface (sensor unit) of the photoelectric conversion device 304.

The photoelectric conversion device 304 is the photoelectric conversion device 100 described in the first embodiment, and has a function of generating a distance signal indicating a distance to the object 330 based on image light from the object 330 and supplying the generated distance signal to the image processing circuit 306.

The image processing circuit 306 has a function of performing image processing for constructing a distance image based on the distance signal supplied from the photoelectric conversion device 304.

The monitor 308 has a function of displaying a distance image (image data) obtained by image processing in the image processing circuit 306. The memory 310 has a function of storing (recording) a distance image (image data) obtained by image processing in the image processing circuit 306.

As described above, according to the present embodiment, by configuring the range image sensor using the photoelectric conversion device of the first embodiment, it is possible to realize a range image sensor capable of acquiring a distance image including more accurate distance information together with improvement in characteristics of the pixel 12.

Fourth Embodiment

Figure 15:
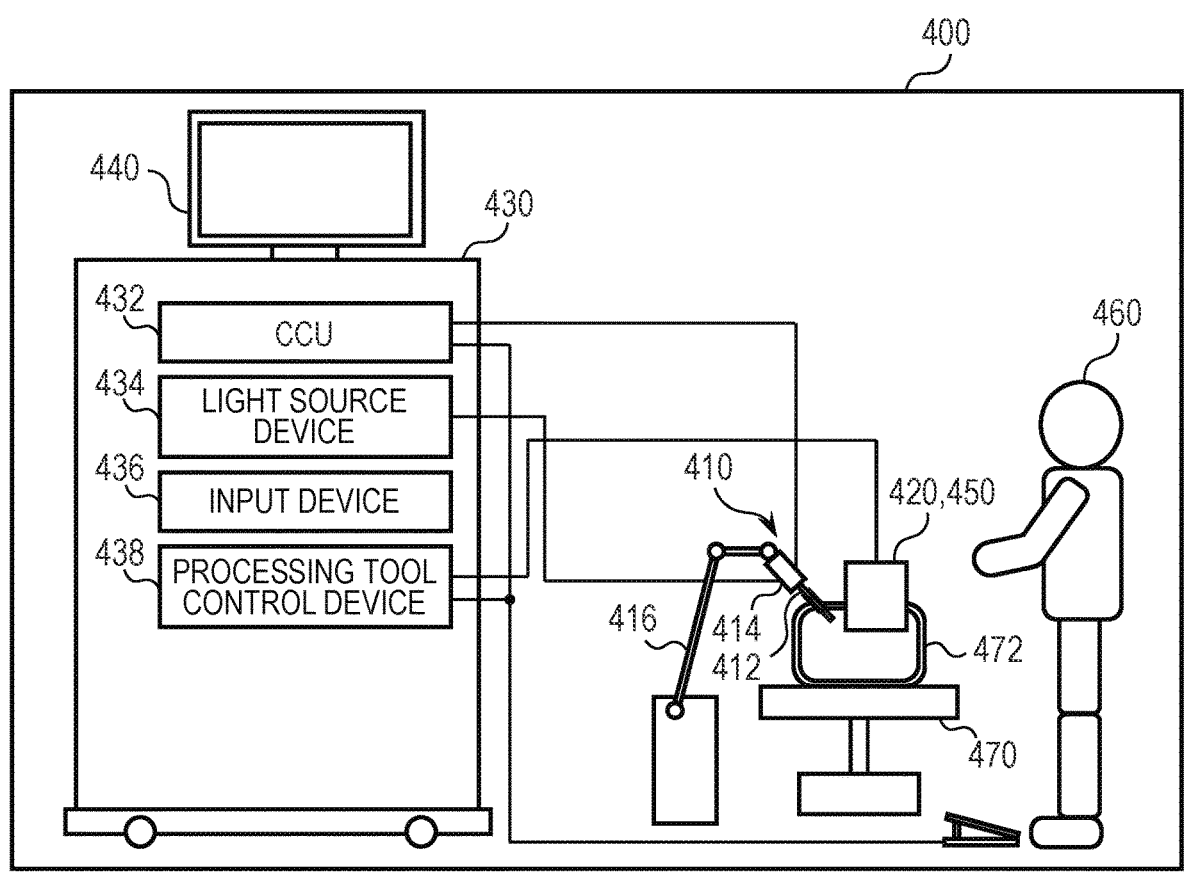
FIG. 15 is a schematic diagram illustrating a configuration example of an endoscopic surgical system according to a fourth embodiment.

An endoscopic surgical system according to a fourth embodiment will be described with reference to FIG. 15. FIG. 15 is a schematic diagram illustrating a configuration example of the endoscopic surgical system according to the present embodiment. In the present embodiment, an endoscopic surgical system will be described as an example of a photodetection system to which the photoelectric conversion device 100 according to the first embodiment is applied.

FIG. 15 illustrates a state in which an operator (surgeon) 460 performs an operation on a patient 472 on a patient bed 470 using an endoscopic surgical system 400.

As illustrated in FIG. 15, the endoscopic surgical system 400 of the present embodiment may include an endoscope 410, a surgical tool 420, and a cart 430 on which various devices for endoscopic surgery are mounted. The cart 430 may include a CCU (Camera Control Unit) 432, a light source device 434, an input device 436, a processing tool control device 438, a display device 440, and the like.

The endoscope 410 includes a lens barrel 412 in which a region of a predetermined length from the tip is inserted into the body cavity of the patient 472, and a camera head 414 connected to the base end of the lens barrel 412. Although FIG. 15 illustrates the endoscope 410 configured as a so-called rigid mirror having a rigid lens barrel 412, the endoscope 410 may be configured as a so-called flexible mirror having a flexible lens barrel. The endoscope 410 is movably held by an arm 416.

An opening into which an objective lens is fitted is provided at the tip of the lens barrel 412. A light source device 434 is connected to the endoscope 410, and light generated by the light source device 434 is guided to the tip of the lens barrel 412 by a light guide extended inside the lens barrel 412, and is irradiated toward an observation target in the body cavity of the patient 472 via the objective lens. The endoscope 410 may be a direct-view mirror, a perspective mirror, or a side-view mirror.

An optical system and a photoelectric conversion device (not illustrated) are provided inside the camera head 414, and reflected light (observation light) from an observation target is focused on the photoelectric conversion device by the optical system. The photoelectric conversion device photoelectrically converts the observation light and generates an electric signal corresponding to the observation light, that is, an image signal corresponding to the observation image. As the photoelectric conversion device, the photoelectric conversion device 100 described in the first embodiment may be used. The image signal is transmitted to the CCU 432 as raw data.

The CCU 432 is configured by a CPU (central processing unit), a GPU (graphics processing unit), or the like, and controls overall operations of the endoscope 410 and the display device 440. Further, the CCU 432 receives an image signal from the camera head 414, and performs various kinds of image processing for displaying an image based on the image signal, such as development processing (demosaic processing).

The display device 440 displays an image based on the image signal subjected to the image processing by the CCU 432 under the control of the CCU 432.

The light source device 434 is constituted by, for example, a light source such as an LED (Light Emitting Diode), and supplies irradiation light to the endoscope 410 when capturing an image of a surgical part or the like.

The input device 436 is an input interface to the endoscopic surgical system 400. The user may input various kinds of information and input instructions to the endoscopic surgical system 400 via the input device 436.

The processing tool control device 438 controls the actuation of the energy processing tool 450 for tissue ablation, incision, blood vessel sealing, etc.

The light source device 434 for supplying irradiation light to the endoscope 410 when capturing an image of the surgical portion may be constituted by a white light source constituted by, for example, an LED, a laser light source, or a combination thereof. When a white light source is configured by a combination of RGB laser light sources, the output intensity and the output timing of each color (each wavelength) may be controlled with high accuracy, so that the white balance of the captured image may be adjusted in the light source device 434. In this case, it is also possible to capture an image corresponding to each of RGB in a time-division manner by irradiating the observation target with laser light from each of the RGB laser light sources in a time-division manner and controlling driving of the imaging device of the camera head 414 in synchronization with the irradiation timing. According to this method, a color image may be obtained without providing a color filter in the imaging device.

Further, the driving of the light source device 434 may be controlled so as to change the intensity of the output light at predetermined time intervals. By controlling the driving of the imaging device of the camera head 414 in synchronization with the timing of changing the intensity of the light to acquire an image in a time-division manner, and by synthesizing the image, it is possible to generate an image in a high dynamic range without so-called blocked up shadows and blown out highlights.

The light source device 434 may be configured to be able to supply light in a predetermined wavelength band corresponding to special light observation. In special light observation, for example, wavelength dependence of light absorption in body tissue is used. Specifically, a predetermined tissue such as a blood vessel in the surface layer of the mucosa is imaged with high contrast by irradiating light in a narrow band compared to the irradiation light (i.e., white light) during normal observation. Alternatively, in special light observation, fluorescence observation for obtaining an image by fluorescence generated by irradiation with excitation light may be performed. In the fluorescence observation, excitation light may be irradiated to the body tissue to observe fluorescence from the body tissue, or a reagent such as indocyanine green (ICG) may be locally poured into the body tissue and the body tissue may be irradiated with excitation light corresponding to the fluorescence wavelength of the reagent to obtain a fluorescence image. The light source device 434 may be configured to be able to supply narrowband light and/or excitation light corresponding to such special light observation.

As described above, according to the present embodiment, by configuring the endoscopic surgical system using the photoelectric conversion devices of the first embodiment, it is possible to realize an endoscopic surgical system capable of acquiring images of higher quality.

Fifth Embodiment

Figure 16A:
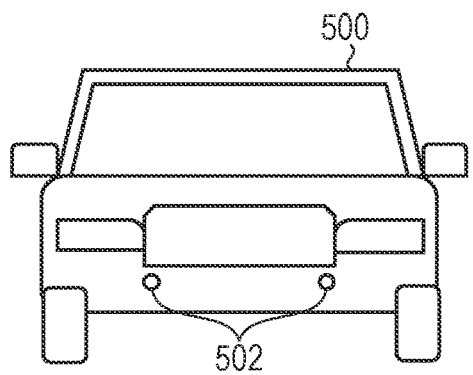
FIG. 16A, FIG. 16B, and FIG. 16C are schematic diagrams illustrating a configuration example of a movable object according to a fifth embodiment.
Figure 16B:
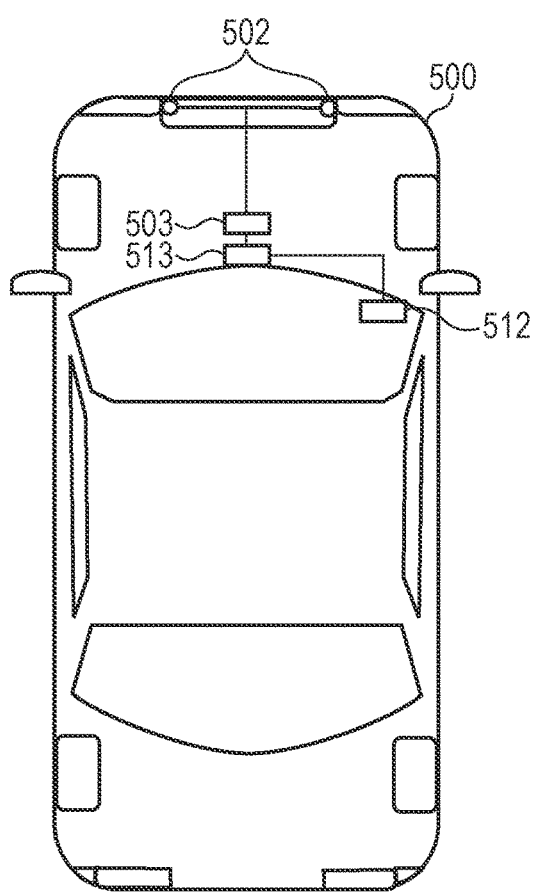
Figure 16C:
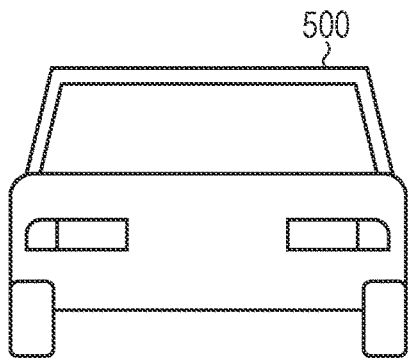
Figure 17:
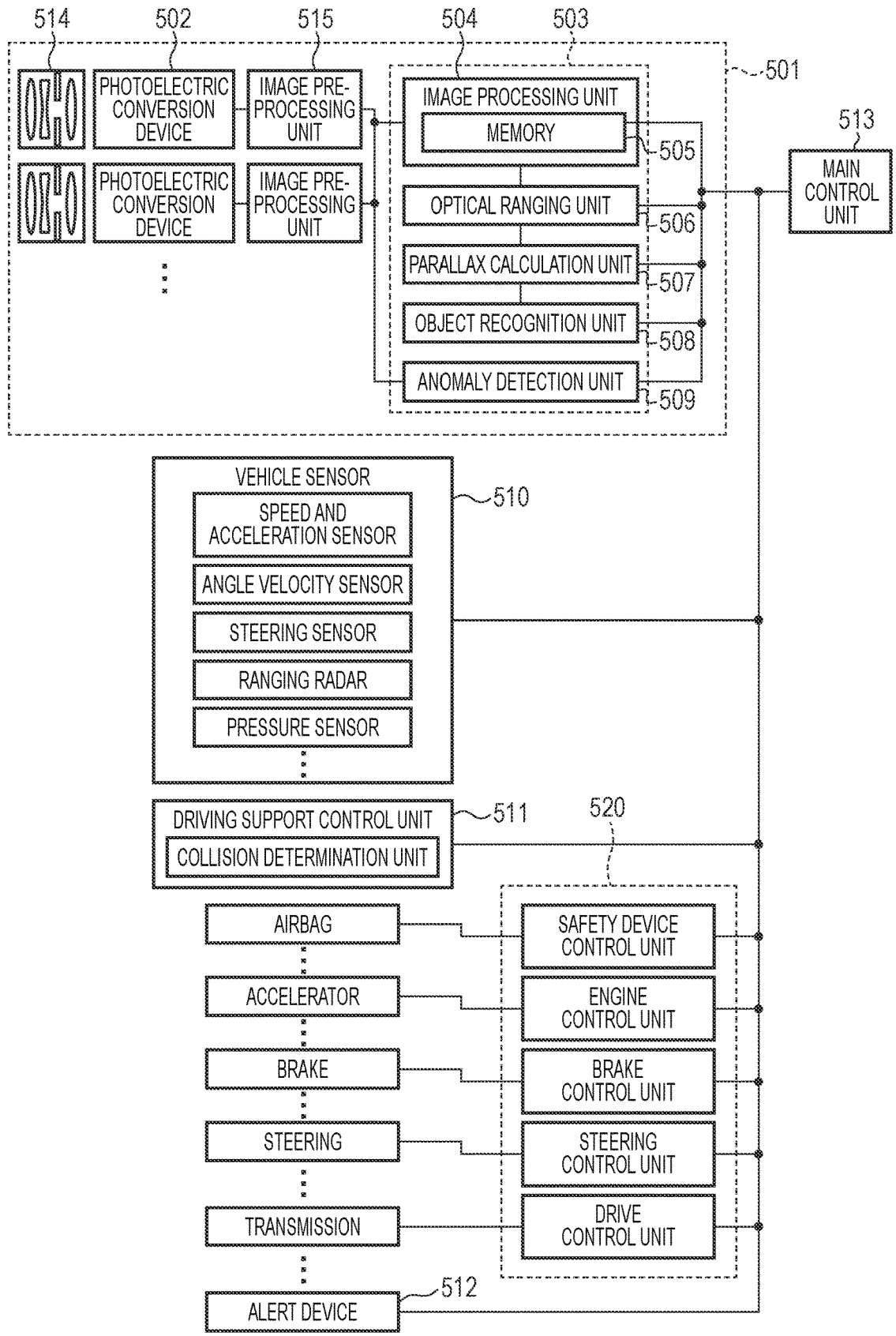
FIG. 17 is a block diagram illustrating a schematic configuration of a photodetection system according to the fifth embodiment.
Figure 18:
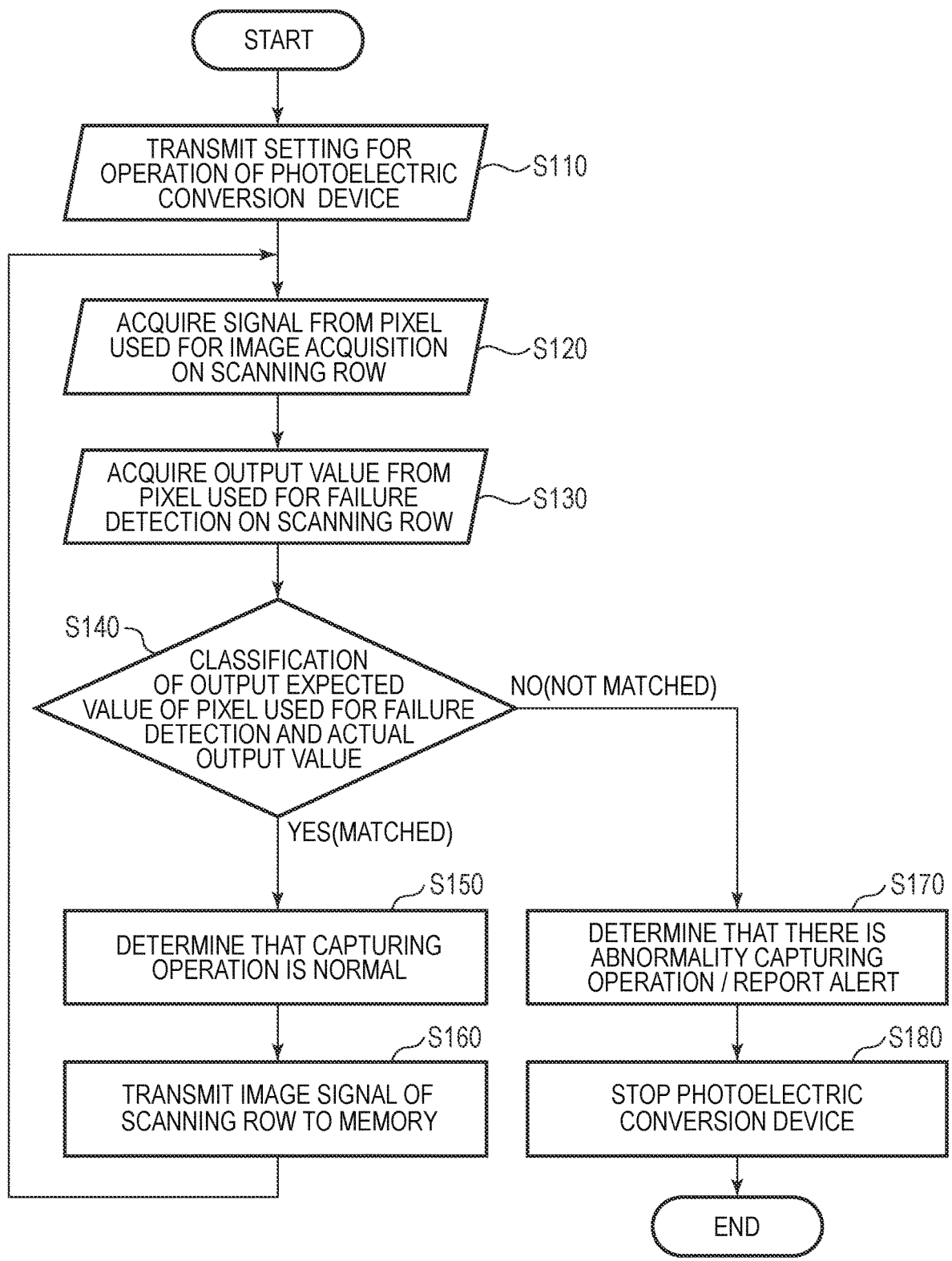
FIG. 18 is a flowchart illustrating an operation of the photodetection system according to the fifth embodiment.

A photodetection system and a movable object according to a fifth embodiment will be described with reference to FIG. 16A to FIG. 18. FIG. 16A to FIG. 16C are schematic diagrams illustrating an example of the configuration of a movable object according to the present embodiment. FIG. 17 is a block diagram illustrating a schematic configuration of the photodetection system according to the present embodiment. FIG. 18 is a flowchart illustrating the operation of the photodetection system according to the present embodiment. In the present embodiment, an application example to an in-vehicle camera will be described as a photodetection system to which the photoelectric conversion device 100 according to the first embodiment is applied.

FIG. 16A to FIG. 16C are schematic diagrams illustrating a configuration example of a movable object (a vehicle system) according to the present embodiment. FIG. 16A to FIG. 16C illustrate a configuration of a vehicle 500 (automobile) as an example of a vehicle system in which a photodetection system to which the photoelectric conversion device according to the first embodiment is applied is incorporated. FIG. 16A is a schematic front view of the vehicle 500, FIG. 16B is a schematic plan view of the vehicle 500, and FIG. 16C is a schematic rear view of the vehicle 500. The vehicle 500 includes a pair of photoelectric conversion devices 502 on the front side thereof. Here, the photoelectric conversion devices 502 are the photoelectric conversion device 100 described in the first embodiment. The vehicle 500 includes an integrated circuit 503, an alert device 512, and a main control unit 513.

FIG. 17 is a block diagram illustrating a configuration example of a photodetection system 501 mounted on the vehicle 500. The photodetection system 501 includes a photoelectric conversion device 502, an image pre-processing unit 515, an integrated circuit 503, and an optical system 514. The photoelectric conversion device 502 is the photoelectric conversion device 100 described in the first embodiment. The optical system 514 forms an optical image of an object onto the photoelectric conversion device 502. The photoelectric conversion device 502 converts the optical image of the object formed by the optical system 514 into an electric signal. The image pre-processing unit 515 performs predetermined signal processing on the signal output from the photoelectric conversion device 502. The function of the image pre-processing unit 515 may be incorporated in the photoelectric conversion device 502. The photodetection system 501 includes at least two sets of the optical system 514, the photoelectric conversion device 502, and the image pre-processing unit 515, and outputs from the image pre-processing unit 515 of each set are input to the integrated circuit 503.

The integrated circuit 503 is an integrated circuit for use in an imaging system, and includes an image processing unit 504, an optical ranging unit 506, a parallax calculation unit 507, an object recognition unit 508, and an anomaly detection unit 509. The image processing unit 504 processes the image signal output from the image pre-processing unit 515. For example, the image processing unit 504 performs image processing such as development processing and defect correction on the output signal of the image pre-processing unit 515. The image processing unit 504 includes a memory 505 that temporarily holds an image signal. The memory 505 may store, for example, positions of known defective pixels in the photoelectric conversion device 502.

An optical ranging unit 506 focuses and measures a subject. The parallax calculation unit 507 calculates distance measurement information (distance information) from a plurality of image data (parallax images) acquired by the plurality of photoelectric conversion devices 502. Each of the photoelectric conversion devices 502 may have a configuration capable of acquiring various kinds of information such as distance information. The object recognition unit 508 recognizes a subject such as a vehicle, a road, a sign, or a person. When the anomaly detection unit 509 detects an abnormality of the photoelectric conversion device 502, the anomaly detection unit 509 notifies the main control unit 513 of the anomaly.

The integrated circuit 503 may be realized by dedicated hardware, a software module, or a combination thereof. It may be realized by FPGA (Field Programmable Gate Array), ASIC (Application Specific Integrated Circuit), or the like, or may be realized by a combination of these.

The main control unit 513 controls overall operations of the photodetection system 501, the vehicle sensor 510, the control unit 520, and the like. The vehicle 500 may not include the main control unit 513. In this case, the photoelectric conversion device 502, the vehicle sensor 510, and the control unit 520 transmit and receive control signals via the communication network. For example, the CAN (Controller Area Network) standard may be applied to the transmission and reception of the control signal. The control unit 520 may include a safety device control unit connected to a safety device such as an airbag, an engine control unit connected to an accelerator, a brake control unit connected to the brake assembly, a steering control unit connected to the steering subsystem, and a drive control unit connected top the transmission assembly.

The integrated circuit 503 has a function of receiving a control signal from the main control unit 513 or transmitting a control signal or a set value to the photoelectric conversion device 502 by its own control unit.

The photodetection system 501 is connected to the vehicle sensor 510, and may detect a traveling state of the own vehicle such as a vehicle speed, a yaw rate, and a steering angle, an environment outside the own vehicle, and a state of another vehicle or obstacle. The vehicle sensor 510 is also a distance information acquisition means for acquiring distance information to an object. It may include a speed and acceleration sensor, an angle velocity sensor, a steering sensor, a ranging radar, and a pressure sensor. The photodetection system 501 is connected to a driving support control unit 511 that performs various driving support functions such as automatic steering, automatic cruise, and collision prevention function. In particular, regarding the collision determination function, the collision estimation, collision presence, and collision absence with another vehicle or obstacle are determined based on the detection result of the photodetection system 501 or the vehicle sensor 510. Thus, avoidance control when collision is estimated and start-up of the safety device at the time of collision are performed.

The photodetection system 501 is also connected to an alert device 512 that issues an alarm to the driver based on the determination result of the collision determination unit. For example, when the possibility of collision is high as the determination result of the collision determination unit, the main control unit 513 performs vehicle control for avoiding collision and reducing damage by applying a brake, returning an accelerator, suppressing engine output, or the like. The alert device 512 sounds an alarm such as a sound, displays alert information on a display unit screen of a car navigation system, a meter panel, or the like, and applies vibration to a seatbelt or a steering wheel, thereby warning the user.

In the present embodiment, an image of the periphery of the vehicle, for example, the front or the rear is taken by the photodetection system 501. FIG. 16B illustrates an arrangement example of the photodetection system 501 when an image of the front of the vehicle is captured by the photodetection system 501.

As described above, the photoelectric conversion device 502 is disposed in front of the vehicle 500. Specifically, when the center line with respect to the advancing/retracting direction or the outer shape (for example, the vehicle width) of the vehicle 500 is regarded as the axis of symmetry, and the two photoelectric conversion devices 502 are arranged in line symmetry with respect to the axis of symmetry, it is preferable in terms of acquiring distance information between the vehicle 500 and the object to be captured and determining the possibility of collision. The photoelectric conversion device 502 is preferably arranged so as not to interfere with the field of view of the driver when the driver visually recognizes the situation outside the vehicle 500 from the driver's seat. The alert device 512 is preferably arranged to easily enter the field of view of the driver.

Next, a failure detection operation of the photoelectric conversion device 502 in the photodetection system 501 will be described with reference to FIG. 18. The failure detection operation of the photoelectric conversion device 502 may be performed according to steps S110 to S180 illustrated in FIG. 18.

Step S110 is a step of performing setting at the time of startup of the photoelectric conversion device 502. That is, a setting for the operation of the photoelectric conversion device 502 is transmitted from the outside of the photodetection system 501 (for example, the main control unit 513)

or from the inside of the photodetection system 501, and the imaging operation and the failure detection operation of the photoelectric conversion device 502 are started.

Next, in step S120, a pixel signal is acquired from the effective pixel. In step S130, an output value from a failure detection pixel provided for failure detection is acquired. The failure detection pixel includes a photoelectric conversion element in the same manner as the effective pixel. A predetermined voltage is written into the photoelectric conversion element. The failure detection pixel outputs a signal corresponding to the voltage written in the photoelectric conversion element. Note that steps S120 and S130 may be reversed.

Next, in step S140, a classification of the output expected value of the failure detection pixel and the actual output value from the failure detection pixel. When the output expected value matches the actual output value as a result of the classification in step S140, the process proceeds to step S150, where it is determined that the imaging operation is normally performed, and the process step proceeds to step S160. In step S160, the pixel signal of the scanning row is transmitted to the memory 505 and is primarily stored. After that, the process returns to step S120, and the failure detection operation is continued. On the other hand, when the output expected value does not match the actual output value as a result of the classification in step S140, the processing step proceeds to step S170. In step S170, it is determined that there is an abnormality in the imaging operation, and an alert is notified to the main control unit 513 or the alert device 512. The alert device 512 displays that an abnormality has been detected on the display unit. Thereafter, in step S180, the photoelectric conversion device 502 is stopped, and the operation of the photodetection system 501 is ended.

In the present embodiment, an example in which the flowchart is looped for each row is exemplified, but the flowchart may be looped for each plurality of rows, or the failure detection operation may be performed for each frame. The alarm in step S170 may be notified to the outside of the vehicle via the wireless network.

Further, in the present embodiment, the control in which the vehicle does not collide with another vehicle has been described, but the disclosure is also applicable to a control in which the vehicle is automatically driven following another vehicle, a control in which the vehicle is automatically driven so as not to protrude from the lane, and the like. Further, the photodetection system 501 may be applied not only to a vehicle such as an own vehicle, but also to a movable object (mobile device) such as a ship, an aircraft, or an industrial robot. In addition, the disclosure may be applied not only to a movable object but also to equipment using object recognition in a wide range such as an intelligent transport system (ITS).

Sixth Embodiment

Figure 19A:
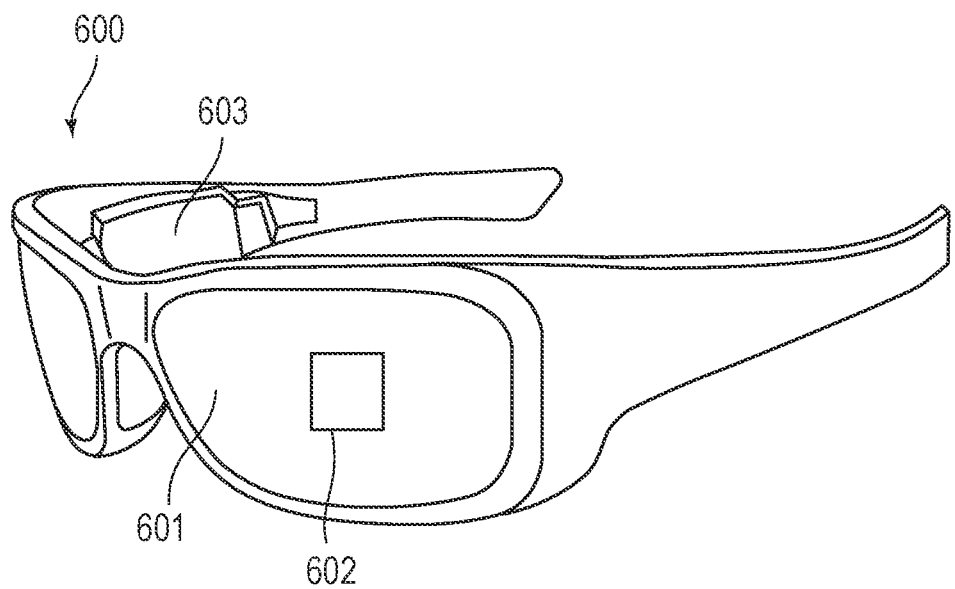
FIG. 19A and FIG. 19B are schematic diagrams illustrating a schematic configuration of a photodetection system according to a sixth embodiment.
Figure 19B:
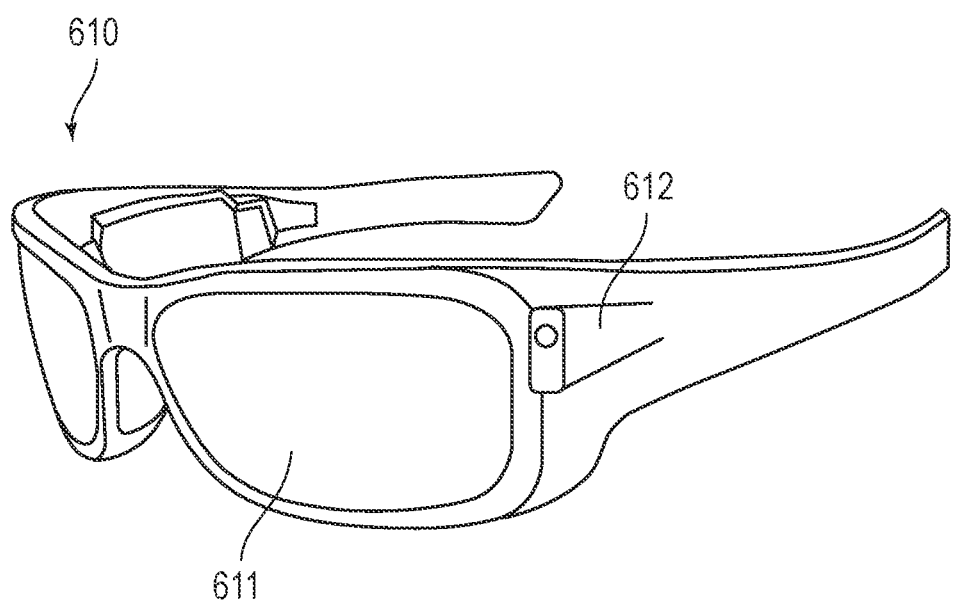

A photodetection system according to a sixth embodiment will be described with reference to FIG. 19A and FIG. 19B. FIG. 19A and FIG. 19B are schematic diagrams illustrating a configuration example of the photodetection system according to the present embodiment. In the present embodiment, an application example to eyeglasses (smartglasses) will be described as a photodetection system to which the photoelectric conversion device 100 according to the first embodiment is applied.

FIG. 19A illustrates eyeglasses 600 (smartglasses) according to one application example. The eyeglasses 600 include a lens 601, a photoelectric conversion device 602, and a control device 603.

The photoelectric conversion device 602 is the photoelectric conversion device 100 described in any of the first embodiment, and is provided in the lens 601. One photoelectric conversion device 602 or a plurality of photoelectric conversion devices 602 may be provided. When a plurality of photoelectric conversion devices 602 are used, a plurality of types of photoelectric conversion devices 602 may be used in combination. The arrangement position of the photoelectric conversion device 602 is not limited to that illustrated in FIG. 19A. A display device (not illustrated) including a light emitting device such as an Organic Light Emitting Diode (OLED) or an LED may be provided on the back side of the lens 601.

The control device 603 functions as a power supply for supplying power to the photoelectric conversion device 602 and the above-described display device. The control device 603 has a function of controlling operations of the photoelectric conversion device 602 and the display device. The lens 601 is provided with an optical system for focusing light on the photoelectric conversion device 602.

FIG. 19B illustrates eyeglasses 610 (smartglasses) according to another application example. The eyeglasses 610 include a lens 611 and a control device 612. A photoelectric conversion device (not illustrated) corresponding to the photoelectric conversion device 602 and a display device may be mounted on the control device 612.

The lens 611 is provided with a photoelectric conversion device in the control device 612 and an optical system for projecting light from the display device, and an image is projected thereon. The control device 612 functions as a power supply for supplying power to the photoelectric conversion device and the display device, and has a function of controlling the operation of the photoelectric conversion device and the display device.

The control device 612 may further include a line-of-sight detection unit that detects the line of sight of the wearer. In this case, the control device 612 is provided with an infrared light emitting unit, and the infrared light emitted from the infrared light emitting unit may be used to detect the line of sight. Specifically, the infrared light emitting unit emits infrared light to the eyeball of the user who is looking at the display image. A captured image of the eyeball is obtained by detecting reflected light of the emitted infrared light from the eyeball by an imaging unit having a light receiving element. The reduction means for reducing light from the infrared light emitting unit to the display section in a plan view may reduce deterioration in image quality.

The line of sight of the user with respect to the display image may be detected from the captured image of the eyeball obtained by capturing infrared light. Any known method may be applied to line-of-sight detection using a captured image of an eyeball. As an example, a line-of-sight detection method based on a Purkinje image caused by reflection of irradiation light on the cornea may be used. More specifically, line-of-sight detection processing based on the pupil cornea reflection method is performed. A line of sight of the user is detected by calculating a line-of-sight vector representing the direction (rotation angle) of the eyeball based on the pupil image and the Purkinje image included in the captured image of the eyeball using the pupil cornea reflection method.

The display device of the present embodiment may include a photoelectric conversion device having a light receiving element, and may be configured to control a display image based on line-of-sight information of a user from the photoelectric conversion device. Specifically, the display device determines, based on the line-of-sight information, a first viewing area to be gazed by the user and a second viewing area other than the first viewing area. The first viewing area and the second viewing area may be determined by a control device of the display device or may be determined by an external control device. When the determination is made by the external control device, the determination is transmitted to the display device via the communication. In the display area of the display device, the display resolution of the first viewing area may be controlled to be higher than the display resolution of the second viewing area. That is, the resolution of the second viewing area may be lower than the resolution of the first viewing area.

The display area may include a first display area and a second display area different from the first display area, and may be configured to determine an area having a high priority from the first display area and the second display area based on the line-of-sight information. The first display area and the second display area may be determined by a control device of the display device or may be determined by an external control device. When the determination is made by the external control device, the determination is transmitted to the display device via the communication. The resolution of the high priority region may be controlled to be higher than the resolution of the regions other than the high priority region. That is, the resolution of a region having a relatively low priority may be low.

Note that AI (artificial intelligence) may be used to determine the first viewing area or the region with high priority. The AI may be a model configured to estimate an angle of a line of sight and a distance to a target object ahead of the line of sight from an image of an eyeball and a direction in which the eyeball of the image is actually viewed as teacher data. The AI program may be provided by a display device, a photoelectric conversion device, or an external device. When the external device has the function, the function is transmitted to the display device via the communication.

In the case of performing display control based on visual recognition detection, the disclosure may be preferably applied to smartglasses further including a photoelectric conversion device for imaging an external image. The smartglasses may display the captured external information in real time.

Modified Embodiments

The disclosure is not limited to the above embodiments, and various modifications are possible.

For example, an example in which a configuration of a part of any embodiment is added to another embodiment or an example in which a configuration of a part of another embodiment is substituted is also an embodiment of the disclosure.

In the first embodiment, as the transistors constituting the pixel circuit, the low withstand voltage transistor and the high withstand voltage transistor are shown, but transistors having different withstand voltages need not necessarily be two types and may be three or more types.

In the first embodiment, a signal IN1 is output from the connection node between the cathode of the photon detection element 22 and the quenching element 24, but the configuration of the photoelectric conversion unit 20 is not limited to this. For example, the quenching element 24 may be connected to the anode side of the photon detection element 22, and a signal IN1 may be acquired from a connection node between the anode of the photon detection element 22 and the quenching element 24.

Further, a switch such as a transistor may be provided between the photon detection element 22 and the quenching element 24 and/or between the photoelectric conversion unit 20 and the pixel signal processing unit 30 to control an electrical connection state between them. Further, a switch such as a transistor may be provided between the node to which the voltage VH is supplied and the quenching element 24 and/or between the node to which the voltage VL is supplied and the photon detection element 22 to control the electrical connection state therebetween.

Although the counter 34 is used as the pixel signal processing unit 30 in the first embodiment, a TDC (Time to Digital Converter) and a memory may be used instead of the counter 34. In this case, the generation timing of the pulse signal output from the signal processing circuit 32 is converted into a digital signal by the TDC. When the timing of the pulse signal is measured, the control pulse pREF (reference signal) is supplied from the vertical scanning circuit unit 40 to the TDC via the control line 14. The TDC acquires, as a digital signal, a signal obtained by setting the input timing of the signal output from each pixel 12 as a relative time with reference to the control pulse pREF.

In this specification, the polarity of a transistor or a semiconductor region is referred to as "conductivity type" in some cases. For example, when n-type is the first conductivity type, p-type is the second conductivity type. When the n-type is the second conductivity type, the p-type is the first conductivity type.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-008658, filed Jan. 22, 2021, which is hereby incorporated by reference herein in its entirety.

What is claimed is:

1. A photoelectric conversion device comprising:
   a pixel including
      a photoelectric conversion unit including an avalanche diode that multiplies charge generated by an incident of photon by avalanche multiplication, and outputting a first signal in accordance with the incident of photon, and
      a signal processing circuit including a logic circuit that outputs a third signal in response to the first signal and a second signal,
   wherein the signal processing circuit includes a first element having a first withstand voltage and a second element having a second withstand voltage lower than the first withstand voltage, wherein the first signal is input to the first element and the second signal is input to the second element, and
   wherein the signal processing circuit includes a plurality of first elements and a plurality of second elements, and includes a first region in which the plurality of first elements is arranged, and a second region in which the plurality of second elements is arranged.

2. The photoelectric conversion device according to claim 1,
   wherein the first signal has a first amplitude, and wherein the second signal has a second amplitude smaller than the first amplitude.

3. The photoelectric conversion device according to claim 1, wherein the third signal is a signal obtained by converting the first signal, which is an analog signal, into a pulse signal.

4. The photoelectric conversion device according to claim 1, wherein the second signal is a signal for controlling an output of the third signal from the signal processing circuit.

5. The photoelectric conversion device according to claim 1,
wherein the device comprises a pixel unit in which a plurality of pixels is arrayed, and
wherein adjacent pixels share the first region.

6. The photoelectric conversion device according to claim 5, wherein the pixel unit is formed by repeatedly arranging unit blocks in which four pixels are arranged mirror-symmetrically.

7. The photoelectric conversion device according to claim 1,
wherein the plurality of first elements includes a first transistor of a first conductivity type and a second transistor of a second conductivity type different from the first conductivity type,
wherein the plurality of second elements includes a third transistor of the first conductivity type and a fourth transistor of the second conductivity type,
wherein the first transistor and the third transistor are provided in a common first well, and
wherein the second transistor and the fourth transistor are provided in a common second well.

8. The photoelectric conversion device according to claim 7, wherein a gate insulating film of the first transistor and a gate insulating film of the second transistor are thicker than a gate insulating film of the third transistor and a gate insulating film of the fourth transistor.

9. The photoelectric conversion device according to claim 7, wherein a direction in which a gate of the first transistor and a gate of the second transistor extend is different from a direction in which a gate of the third transistor and a gate of the fourth transistor extend.

10. The photoelectric conversion device according to claim 1,
wherein the photoelectric conversion unit further includes a quenching element that suppresses avalanche multiplication of the avalanche diode, and
wherein the quenching element is constituted by a third element having the second withstand voltage.

11. The photoelectric conversion device according to claim 1, wherein the power supply voltage supplied to the first element and the power supply voltage supplied to the second element are the same.

12. A photodetection system comprising:
the photoelectric conversion device according to claim 1; and
a signal processing device that processes a signal output from the photoelectric conversion device.

13. The photodetection system according to claim 12, wherein the signal processing device generates a distance image representing distance information to an object based on the signal.

14. A movable object comprising:
the photoelectric conversion device according to claim 1;
a distance information acquisition unit that acquires distance information to an object from a parallax image based on a signal output from the photoelectric conversion device; and
a control unit that controls the movable object based on the distance information.

15. A photoelectric conversion device comprising:
a pixel including
a photoelectric conversion unit including an avalanche diode that multiplies charge generated by an incident of photon by avalanche multiplication, and outputting a first signal in accordance with the incident of photon, and
a signal processing circuit including a logic circuit that outputs a third signal in response to the first signal and a second signal,
wherein the signal processing circuit includes a first element having a first withstand voltage and a second element having a second withstand voltage lower than the first withstand voltage, wherein the first signal is input to the first element and the second signal is input to the second element, and
wherein the logic circuit includes a NOR circuit that receives the first signal and the second signal as input signals and outputs the third signal.

16. The photoelectric conversion device according to claim 15, wherein the NOR circuit includes the first element and the second element.

17. A photodetection system comprising:
the photoelectric conversion device according to claim 15; and
a signal processing device that processes a signal output from the photoelectric conversion device.

18. A photoelectric conversion device comprising:
a pixel including
a photoelectric conversion unit including an avalanche diode that multiplies charge generated by an incident of photon by avalanche multiplication, and outputting a first signal in accordance with the incident of photon, and
a signal processing circuit including a logic circuit that outputs a third signal in response to the first signal and a second signal,
wherein the signal processing circuit includes a first element having a first withstand voltage and a second element having a second withstand voltage lower than the first withstand voltage, wherein the first signal is input to the first element and the second signal is input to the second element, and
wherein the logic circuit includes a NOT circuit that receives the first signal as an input signal, and a NAND circuit that receives an output signal of the NOT circuit and the second signal, and outputs the third signal.

19. The photoelectric conversion device according to claim 18,
wherein the NOT circuit includes the first element, and
wherein the NAND circuit includes the first element and the second element.

20. A photodetection system comprising:
the photoelectric conversion device according to claim 18; and
a signal processing device that processes a signal output from the photoelectric conversion device.

21. A photoelectric conversion device comprising:
a pixel including
a photoelectric conversion unit including an avalanche diode that multiplies charge generated by an incident of photon by avalanche multiplication, and outputting a first signal in accordance with the incident of photon, and a signal processing circuit including a logic circuit that outputs a third signal in response to the first signal and a second signal, wherein the signal processing circuit includes a first element and a second element, wherein the first signal is input to the first element, and the second signal is input to the second element, wherein a thickness of a gate insulating film of a transistor included in the first element is thicker than a thickness of a gate insulating film of a transistor included in the second element, wherein the signal processing circuit includes a plurality of first elements and a plurality of second elements, and includes a first region in which the plurality of first elements is arranged, and a second region in which the plurality of second elements is arranged, wherein the plurality of first elements includes a first transistor of a first conductivity type and a second transistor of a second conductivity type different from the first conductivity type, wherein the plurality of second elements includes a third transistor of the first conductivity type and a fourth transistor of the second conductivity type, wherein the first transistor and the third transistor are provided in a common first well, and wherein the second transistor and the fourth transistor are provided in a common second well.

22. The photoelectric conversion device according to claim 21, wherein the first signal has a first amplitude, wherein the second signal has a second amplitude smaller than the first amplitude.

23. The photoelectric conversion device according to claim 21, wherein the third signal is a signal obtained by converting the first signal, which is an analog signal, into a pulse signal.

24. The photoelectric conversion device according to claim 21, wherein a gate insulating film of the first transistor and a gate insulating film of the second transistor are thicker than a gate insulating film of the third transistor and a gate insulating film of the fourth transistor.

25. The photoelectric conversion device according to claim 21, wherein the photoelectric conversion unit further includes a quenching element that suppresses avalanche multiplication of the avalanche diode, and wherein the quenching element is constituted by a third element having the second withstand voltage.

26. A photodetection system comprising:

the photoelectric conversion device according to claim 21; and a signal processing device that processes a signal output from the photoelectric conversion device.

* * * * *